US012588273B2

(12) United States Patent
Sung et al.

(10) Patent No.: US 12,588,273 B2
(45) Date of Patent: Mar. 24, 2026

(54) STACKED ELECTRONIC DEVICES HAVING INDEPENDENT GATES

(71) Applicant: International Business Machines Corporation, Armonk, NY (US)

(72) Inventors: Min Gyu Sung, Latham, NY (US);
Ruilong Xie, Niskayuna, NY (US);
Julien Frougier, Albany, NY (US);
Chanro Park, Clifton Park, NY (US);
Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 454 days.

(21) Appl. No.: 18/191,895

(22) Filed: Mar. 29, 2023

(65) Prior Publication Data

US 2024/0332082 A1     Oct. 3, 2024

(51) Int. Cl.
| | |
|---|---|
| *H10D 84/03* | (2025.01) |
| *H10D 48/32* | (2025.01) |
| *H10D 84/01* | (2026.01) |
| *H10D 88/00* | (2026.01) |
| *H10D 89/00* | (2026.01) |
| *H10F 39/00* | (2025.01) |

(52) U.S. Cl.
CPC ......... *H10D 84/038* (2025.01); *H10D 48/366* (2025.01); *H10D 84/0151* (2025.01); *H10D 88/01* (2025.01); *H10D 89/217* (2025.01); *H10F 39/8037* (2025.01)

(58) Field of Classification Search
CPC .. H10D 84/038; H10D 84/0151; H10D 88/01; H10D 89/217; H10D 48/366; H10F 39/8037

USPC ......................................................... 438/109
See application file for complete search history.

(56) References Cited

U.S. PATENT DOCUMENTS

| | | |
|---|---|---|
| 7,804,134 B2 | 9/2010 | Coronel et al. |
| 10,192,819 B1 | 1/2019 | Chanemougame et al. |
| 10,192,867 B1 | 1/2019 | Frougier et al. |
| 10,510,622 B1 | 12/2019 | Frougier et al. |
| 10,770,479 B2 | 9/2020 | Smith et al. |

(Continued)

FOREIGN PATENT DOCUMENTS

CN          112687626 A     4/2021

OTHER PUBLICATIONS

Jung et al., "Performance analysis on complementary FET (CFET) relative to standard CMOS with nanosheet FET," IEEE Journal of the Electron Devices Society, vol. 10, Dec. 2021, pp. 78-82.

(Continued)

*Primary Examiner* — Lex H Malsawma
*Assistant Examiner* — Colin Russell McCutcheon
(74) *Attorney, Agent, or Firm* — CANTOR COLBURN LLP; Kimberly Zillig

(57) ABSTRACT

Embodiments of the invention are directed to an integrated circuit (IC) that includes a stacked device configuration having a top electronic device positioned over a bottom electronic device, along with an isolation region operable to electrically isolate at least a gate region of the top electronic device from a gate region of the bottom electronic device. The gate region of the top electronic device includes a first conductive material, and the gate region of the bottom electronic device includes a second conductive material that is different from the first conductive material.

20 Claims, 17 Drawing Sheets

(56)           References Cited

U.S. PATENT DOCUMENTS

| | | | |
|---|---|---|---|
| 11,126,775 | B2 | 9/2021 | Peng et al. |
| 11,522,048 | B2 | 12/2022 | Bomberger et al. |
| 12,336,294 | B2 | 6/2025 | Xie et al. |
| 2021/0265348 | A1* | 8/2021 | Xie ......................... H10D 88/01 |
| 2022/0216340 | A1* | 7/2022 | Lin ...................... H10D 84/013 |
| 2022/0367658 | A1 | 11/2022 | Yim et al. |
| 2023/0138121 | A1* | 5/2023 | Park ....................... H10D 88/00 |
| | | | 257/351 |

OTHER PUBLICATIONS

Mukesh et al., "A Review of the Gate-All-Around Nanosheet FET Process Opportunities," Electronics, 11, 3589, Nov. 3, 2022, pp. 1-11.

Schuddinck, et al, "The Complementary FET (CFET) for CMOS scaling beyond N3", IEEE, 2018, pp. 141-142.

* cited by examiner

Top-down View

NS

Gate

Nanosheet-based reference structure 101

STACKED ELECTRONIC DEVICES HAVING INDEPENDENT GATES

BACKGROUND

The present invention relates in general to fabrication methods and resulting structures for semiconductor devices. More specifically, the present invention relates to fabrication methods and resulting structures for forming stacked electronic devices having independent gate regions.

In contemporary semiconductor device fabrication processes, a large number of metal oxide semiconductor field effect transistors (MOSFETs), such as n-type field effect transistors (nFETs) and p-type field effect transistors (pFETs), are fabricated on a single wafer. Non-planar MOS-FET architectures (e.g., fin-type FETs (FinFETs) and nanosheet FETs) can provide increased device density and increased performance over planar MOSFETs. For example, nanosheet FETs, in contrast to conventional planar MOS-FETs, include a gate stack that wraps around the full perimeter of multiple stacked and spaced-apart nanosheet channel regions for a reduced device footprint and improved control of channel current flow.

To further improve wafer density, complimentary FET (CFET) architectures have been developed. In CFET architectures, transistor devices are stacked on top of each other, allowing further maximization of the effective channel width and further reducing device footprint. Fabricating CFETs presents a number of challenges, including, for example, the types of devices that can be stacked, making effective electrical contact to the active components of the stacked devices, and providing the necessary electrical isolation for the stacked devices.

SUMMARY

Embodiments of the invention are directed to an integrated circuit (IC) that includes a stacked device configuration having a top electronic device positioned over a bottom electronic device, along with an isolation region operable to electrically isolate at least a gate region of the top electronic device from a gate region of the bottom electronic device. The gate region of the top electronic device includes a first conductive material, and the gate region of the bottom electronic device includes a second conductive material that is different from the first conductive material.

The above-described embodiments of the invention provide technical benefits and technical effects. For example, because the first conductive material is different from the second conductive material, the gate region of the top electronic device can be provided with different characteristics than the gate region of the bottom electronic device. Additionally, because the gate region of the top electronic device can be provided with different characteristics than the gate region of the bottom electronic device, the top electronic device can be a first type of electronic device, and the bottom electronic device can be a second type of electronic device that is different from the first type of electronic device. The ability to mix and match different types of electronic devices in the stacked device configuration provides improved flexibility in generating the design and floorplan of the IC.

In addition to one or more of the features described above, or as an alternative to any of the foregoing embodiments of the invention, a work function of the first conductive material is different from a work function of the second conductive material.

The above-described embodiments of the invention provide technical benefits and technical effects. For example, because the first conductive material is different from the second conductive material, the work function of the first conductive material can be different from the work function of the second conductive material, which enables the implementation of a type of the top electronic device that requires a different work function than is required for the type of the bottom electronic device. The ability to mix and match different types of electronic devices in the stacked device configuration provides improved flexibility in generating the design and floorplan of the IC.

In addition to one or more of the features described above, or as an alternative to any of the foregoing embodiments of the invention, the top electronic device includes a p-type transistor, and the bottom electronic device includes an n-type transistor. Alternatively, the top electronic device can include an n-type transistor, and the bottom electronic device can include a p-type transistor.

The above-described embodiments of the invention provide technical benefits and technical effects. For example, because the top electronic device can be a first type of electronic device, and the bottom electronic device can be a second type of electronic device that is different from the first type of electronic device, this feature facilitates providing the first type of electronic device as a p-type transistor and providing the second type of electronic device as an n-type transistor. Alternatively, this feature also facilitates providing the first type of electronic device as an n-type transistor and providing the second type of electronic device as a p-type transistor. The ability to mix and match different types of electronic devices in the stacked device configuration provides improved flexibility in generating the design and floorplan of the IC.

In addition to one or more of the features described above, or as an alternative to any of the foregoing embodiments, the top electronic device includes a memory device operable to perform storage operations; and the bottom electronic device includes a transistor operable to perform logic operations.

The above-described embodiments of the invention provide technical benefits and technical effects. For example, because the top electronic device can be a first type of electronic device, and the bottom electronic device can be a second type of electronic device that is different from the first type of electronic device, this feature facilitates providing the first type of electronic device as a memory device operable to perform storage operations, and providing the second type of electronic device as transistor operable to perform logic operations. The ability to mix and match different types of electronic devices in the stacked device configuration provides improved flexibility in generating the design and floorplan of the IC.

In addition to one or more of the features described above, or as an alternative to any of the foregoing embodiments, a portion of the first gate contact structure is electrically coupled to the gate region of the top electronic device through a sidewall of the gate region of the top electronic device.

The above-described embodiments of the invention provide technical benefits and technical effects. For example, providing an electronic connection through a sidewall of the gate region of the top electronic device to a portion of the first gate contact structure provides a relatively large interface between the sidewall of the gate region of the top electronic device and the portion of the first gate contact structure, thereby providing decreased contact resistance.

In addition to one or more of the features described above, or as an alternative to any of the foregoing embodiments, the first gate contact structure is electronically isolated except for the portion of the first gate contact structure that is electrically coupled through the sidewall of the gate region of the top electronic device.

The above-described embodiments of the invention provide technical benefits and technical effects. For example, isolation of the first gate contact structure ensure that the only path for current to flow from the first gate contact structure is through the portion of the portion of the first gate structure that is electrically connected to the sidewall of the gate region of the top electronic device, thereby further providing decreased contact resistance.

Embodiments of the invention also include fabrication methods having substantially the same features, functions, technical benefits, and technical effects of the above-described IC structure.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 4-16 depict multiple cross-sectional views of a stacked nanosheet-based structure after various fabrication operations for forming the novel stacked device configuration shown in FIG. 2, in which:

FIG. 4 depicts cross-sectional views of the stacked nanosheet-based structure after initial fabrication operations in accordance with aspects of the present invention;

FIG. 5 depicts cross-sectional views of the stacked nanosheet-based structure after additional fabrication operations in accordance with aspects of the present invention;

FIG. 6 depicts cross-sectional views of the stacked nanosheet-based structure after additional fabrication operations in accordance with aspects of the present invention;

FIG. 7 depicts cross-sectional views of the stacked nanosheet-based structure after additional fabrication operations in accordance with aspects of the present invention;

FIG. 8 depicts cross-sectional views of the stacked nanosheet-based structure after additional fabrication operations in accordance with aspects of the present invention;

FIG. 9 depicts cross-sectional views of the stacked nanosheet-based structure after additional fabrication operations in accordance with aspects of the present invention;

FIG. 10 depicts cross-sectional views of the stacked nanosheet-based structure after additional fabrication operations in accordance with aspects of the present invention;

FIG. 11 depicts cross-sectional views of the stacked nanosheet-based structure after additional fabrication operations in accordance with aspects of the present invention;

FIG. 12 depicts cross-sectional views of the stacked nanosheet-based structure after additional fabrication operations in accordance with aspects of the present invention;

FIG. 13 depicts cross-sectional views of the stacked nanosheet-based structure after additional fabrication operations in accordance with aspects of the present invention;

FIG. 14 depicts cross-sectional views of the stacked nanosheet-based structure after additional fabrication operations in accordance with aspects of the present invention;

FIG. 15 depicts cross-sectional views of the stacked nanosheet-based structure after additional fabrication operations in accordance with aspects of the present invention; and FIG. 16 depicts cross-sectional views of the stacked nanosheet-based structure after additional fabrication operations in accordance with aspects of the present invention.

DETAILED DESCRIPTION

Figure 1:
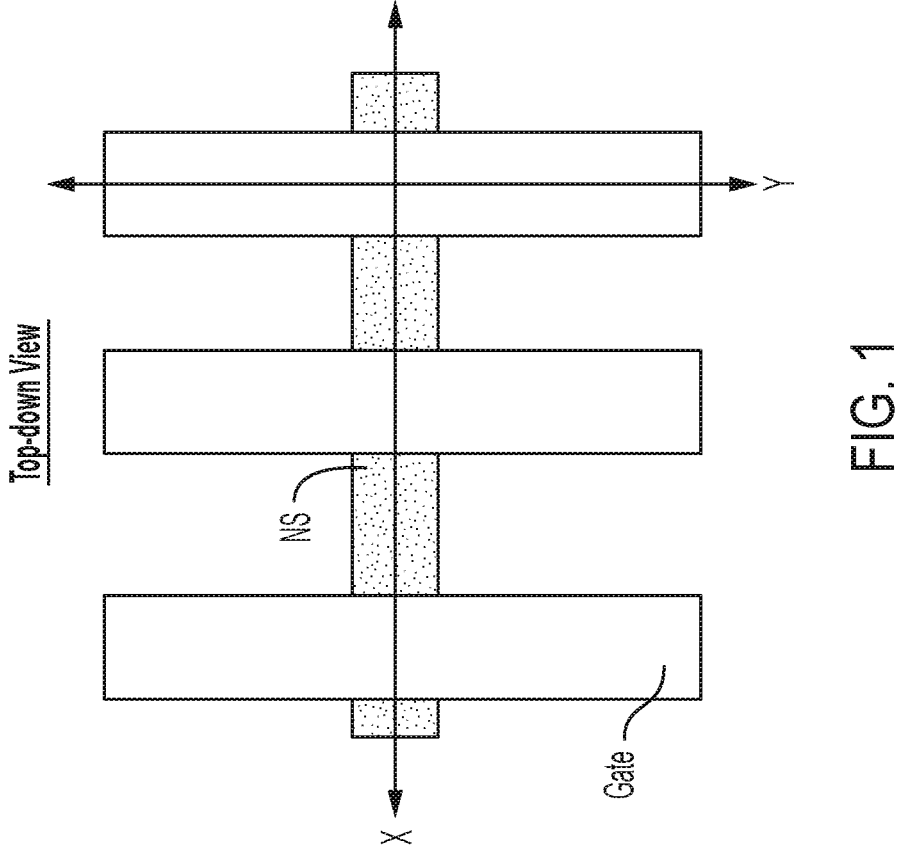
FIG. 1 depicts a top-down view of a simplified nanosheet-based reference structure 101 that provides a reference point for the various cross-sectional views (X-view, Y-view) shown in FIGS. 2-16.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, semiconductor devices (e.g., FETs) are formed using active regions of a wafer. The active regions are defined by isolation regions used to separate and electrically isolate adjacent semiconductor devices. For example, in an IC having a plurality of MOSFETs, each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of thin nanosheets (e.g., about 3 nm to about 8 nm thick). In a known GAA configuration, a nanosheet-based FET includes a source region, a drain region and stacked, spaced-apart nanosheet channels between the source and drain regions. A gate surrounds the stacked, spaced-apart nanosheet channels and regulates electron flow through the nanosheet channels between the source and drain regions.

GAA nanosheet FETs are fabricated by forming alternating layers of non-sacrificial nanosheets and sacrificial nanosheets. The sacrificial nanosheets are released from the non-sacrificial nanosheets before the FET device is finalized. For n-type FETs, the non-sacrificial nanosheets are typically silicon (Si) and the sacrificial nanosheets are typically silicon germanium (SiGe). For p-type FETs, the non-sacrificial nanosheets can be SiGe and the sacrificial nanosheets can be Si. In some implementations, the non-sacrificial nanosheet of a p-type FET can be SiGe or Si, and the sacrificial nanosheets can be Si or SiGe. Forming the GAA nanosheets from alternating layers of non-sacrificial nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior non-sacrificial electrostatics control, which is necessary for continuously scaling gate lengths down to seven (7) nanometer CMOS technology and below. The use of multiple layered SiGe/Si sacrificial/non-sacrificial nanosheets (or Si/SiGe sacrificial/non-sacrificial nanosheets) to form the channel regions in GAA FET semiconductor devices provides desirable device characteristics, including the introduction of strain at the interface between SiGe and Si.

To further improve wafer density, complimentary FET (CFET) architectures have been developed. In CFET architectures, transistor devices (e.g., GAA nanosheet FETs) are stacked on top of each other, allowing further maximization of the effective channel width and further reducing device footprint. Fabricating CFETs presents a number of challenges, including, for example, the types of devices that can be stacked, making effective electrical contact to the active components of the stacked devices, and providing the necessary electrical isolation for the stacked devices.

Turning now to an overview of aspects of the invention, embodiments of the invention provide a novel stacked device configuration having a CFET architecture in which independent gates are provided for the stacked device configuration. A configuration of dielectric regions is provided that electrically isolates the bottom electronic device from the top electronic device. Thus, each independent gate can be fabricated from different materials than the other independent gate. For example, the top electronic device can be provided with a gate material having a first work function, and the bottom electronic device can be provided with a gate material having a second work function that is different than the first work function. Additionally, fabrication methods are provided for forming gate contacts for the top electronic device and the bottom electronic device configured and arranged to extend through the top gate structures without increasing the footprint of the CFET architecture. The fabrication methods disclosed herein are sufficiently flexible to enable the fabrication of a variety different device types to be combined into a CFET architecture. For example, a bottom electronic device in the CFET architecture can be a switching device (e.g., a transistor) operable to perform logic-based switching operations, and the top electronic device in the CFET architecture can be a storage device (e.g., a memory element), operable to perform storage-based operations.

Although embodiments of the invention described herein focus on electronic devices having GAA nanosheet architectures, the various aspects of the invention described herein can be applied to electronic devices having other FET architectures, including, for example FinFET architectures. Additionally, although embodiments of the invention described herein depict two (2) electronic devices in the stacked electronic device configuration, any number of electronic device can be provided in the stacked electronic device configuration, and each electronic device can be electronically isolated from the others such that different electronic devices having different architectures and functions can be provided in the stacked electronic device configuration.

Turning now to a more detailed description of embodiments of the invention, FIG. 1 depicts a two-dimensional top-down view of a simplified nanosheet-based reference structure 101 having a nanosheet stack (NS) and a gate (Gate). The nanosheet-based reference structure 101 provides a reference point for the various cross-sectional views (X-view, Y-view) shown in FIGS. 2-16. More specifically, the X-view is a side view taken along the NS of the reference structure 101, and the Y-view is an end view taken along the active Gate of the reference structure 101. Although the cross-sectional diagrams depicted in FIGS. 2-16 are two-dimensional, the diagrams depicted in FIGS. 2-16 represent three-dimensional structures. Thus, to assist with visualizing the three-dimensional structures, the top-down view of the nanosheet-based reference structure 101 provides a reference point for the various cross-sectional views (the X-view and the Y-view) shown in FIGS. 2-16.

Figure 2:
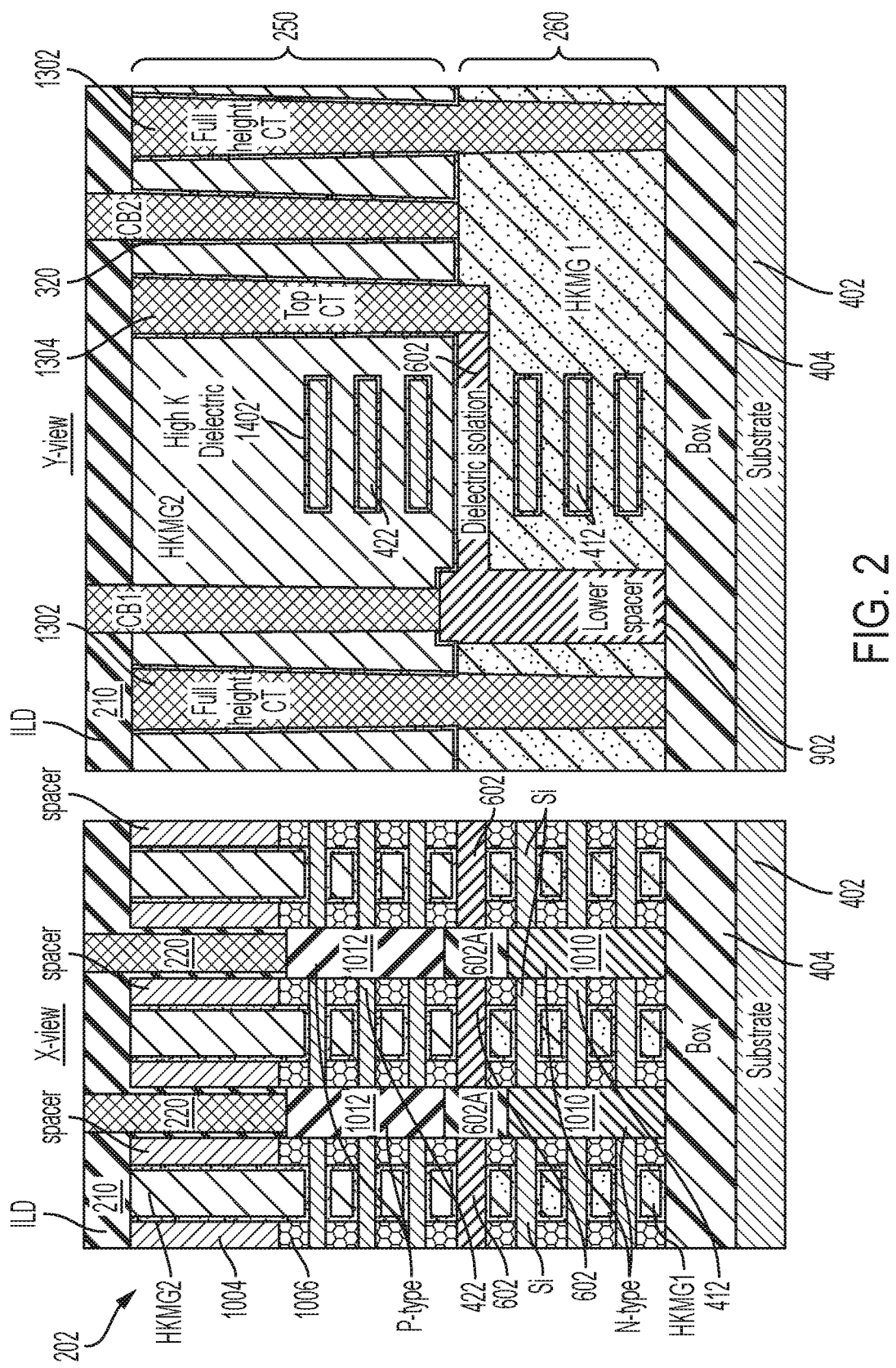
FIG. 2 depicts cross-sectional views of a novel stacked device configuration having a complimentary FET (CFET) architecture and embodying aspects of the invention.

FIG. 2 depicts cross-sectional views (an X-view and a Y-view) of a novel stacked device configuration 202 having a CFET architecture and embodying aspects of the invention. The stacked device configuration 202 defines a top electronic device 250 positioned over a bottom electronic device 260. The bottom electronic device 260 is a nanosheet-based n-type transistor having stacked and spaced-apart channel nanosheets 412 surrounded by a high-k metal gate (HKMG) structure identified in FIG. 2 as HKMG1, along with a high-k dielectric 1402. Although it is conventional to represent the high-k dielectric as incorporated within the illustrated representation of the HKMG, for ease of illustration and description, in this detailed description, the HKMG and its associated high-k dielectric are shown separately as a primary metal region represented by HKMB1), and as a gate dielectric region represented by the high-k dielectric 1402. In some embodiments of the invention, the high-k dielectric 1402 associated with HKMG1 is a different material than the high-k dielectric 1402 associated with the HKMG2. The channel nanosheets 412 are coupled to n-type doped source or drain (S/D) regions 1010. The top electronic device 250 is a nanosheet-based p-type transistor having stacked and spaced-apart channel nanosheets 422 surrounded by an HKMG structure identified as HKMG2, along with the high-k gate dielectric 1402. The channel nanosheets 422 are coupled to p-type doped S/D regions 1012. A configuration of electrical isolation regions are defined that include a dielectric isolation region (or dielectric isolation layer) 602, a lower spacer region 902, replacement dielectric isolation regions 602A, vertical isolation regions 1302, 1304, and isolation liners 320. The configuration of electrical isolation regions enable, inter alia, the materials of the HKMG2 and the high-k dielectric 1402

(specifically the WFM) to be different from the HKMG1 and the high-k dielectric 1402. Accordingly, the bottom electronic device 260 with the HKMG1 and the high-k dielectric 1402 can be a first type of electronic device (e.g., an n-type transistor), and the top electronic device 250 with the HKMG2 and the high-k dielectric 1402 can be a second type of electronic device (e.g., a p-type transistor, or a memory element) that is different from the first type of electronic device. The gate contact CB1 extends vertically through the HKMG2 and allows convenient contact through a sidewall of the HKMG2, and the gate contact CB2 also extends vertically through the HKMG2 but is electrically isolated from the HKMG2 while allowing convenient contact to the HKMG1 through a top surface of the HKMG1. Additional details of how the top electronic device 250 and the bottom electronic device 260 can be fabricated are provided subsequently herein in connection with the description of the fabrication operations depicted in FIG. 4-16.

Figure 3A:
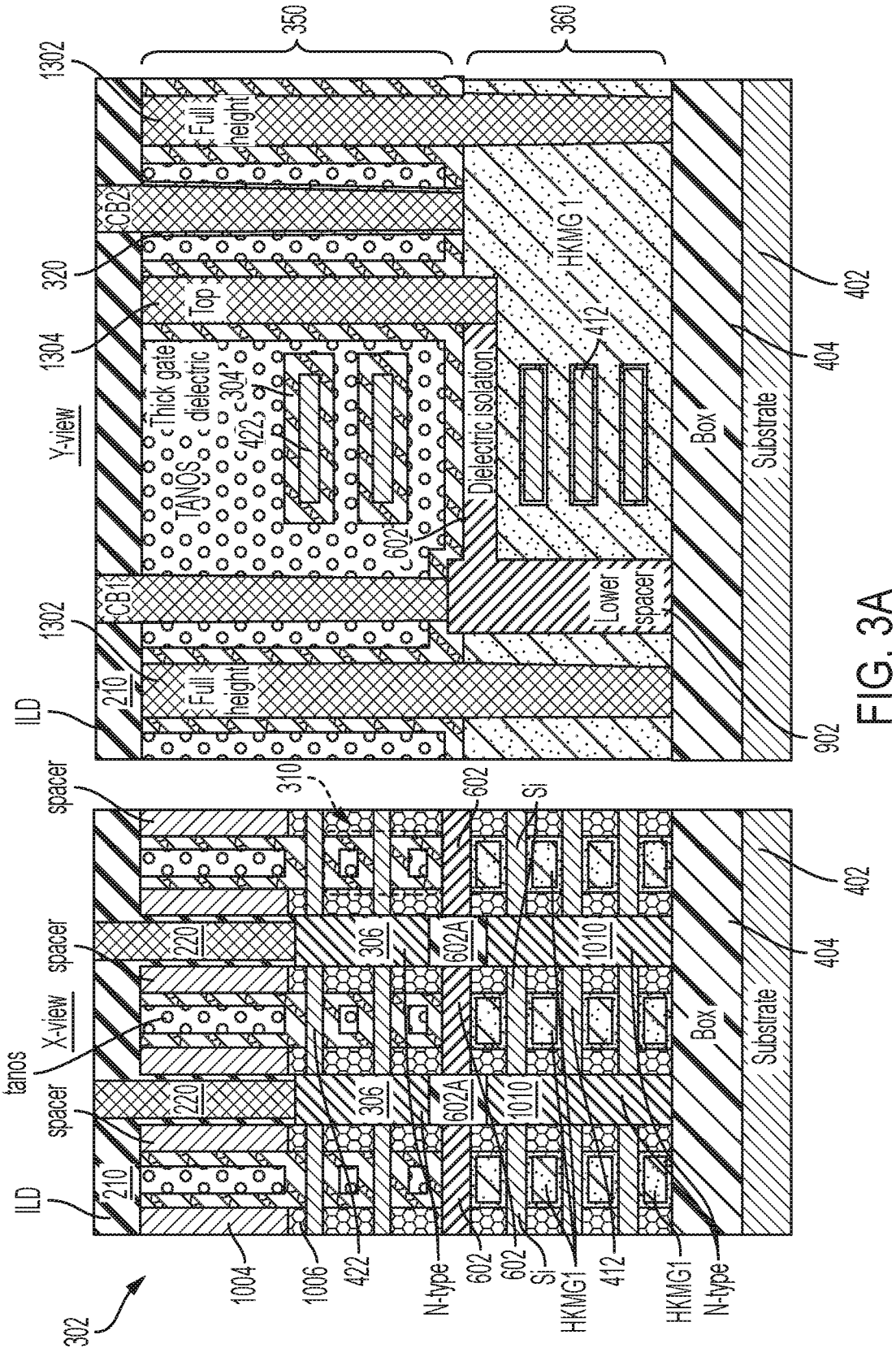
FIG. 3A depicts cross-sectional views of a novel stacked device configuration having a CFET architecture and embodying aspects of the invention.

FIG. 3A depicts cross-sectional views (an X-view and a Y-view) of a novel stacked device configuration 302 having a CFET architecture and embodying aspects of the invention. The stacked device configuration 302 defines a top electronic device 350 positioned over a bottom electronic device 360. The bottom electronic device 360 is a nanosheet-based n-type transistor having stacked and spaced-apart channel nanosheets 412 surrounded by a HKMG structure identified as HKMG1 and the high-k dielectric 1402. The channel nanosheets 412 are coupled to n-type doped S/D regions 1010. The top electronic device 350 includes nanosheet-based MOSFET memory devices 310 each having one of the Si channel nanosheets 422 surrounded by a HKMG structure identified as TANOS (Tantalum-Alumina-Nitride-Oxide-Silicon), along with a relatively thick gate dielectric 304. The relatively thick gate dielectric 304 can be implemented as a so-called extended-gate (EG) dielectric 304, which is configured to tolerate larger gate threshold voltages (e.g., larger than required for transistor switching operations) that are required by electronic devices such as MOSFETs that function as memory cells. In embodiments of the invention, the EG dielectric 304 is relatively thick (e.g., from about 1 nm to about 10 nm). The thickness of the EG dielectric 304 is selected to increase the threshold voltage $V_T$ that can be tolerated by memory device 310. The EG dielectric 304 can be deposited conformally using any suitable conformal deposition process (e.g., atomic layer depositions (ALD)), and can include interfacial layers (IL) and high-k dielectric layers. In some embodiments of the invention, the high-k dielectric layers can modify the work function of the TANOS control gate 370. The high-k dielectric layer can be made of, for example, silicon oxide, silicon nitride, silicon oxynitride, boron nitride, high-k materials, or any combination of these materials. Examples of other high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

In the top electronic device 350, the channel nanosheets 422 are coupled to p-type doped S/D regions 306. A configuration of electrical isolation regions are defined by a dielectric isolation region 602, a lower spacer region 902, a replacement dielectric isolation region 602A, vertical isolation regions 1302, 1304, and isolation liners 320. The configuration of electrical isolation regions enable, inter alia, the materials of the TANOS and the relatively thick gate dielectric layer 304 (specifically the WFM) to be different from the HKMG1 and the high-k dielectric 1402. Accordingly, the bottom electronic device 360 with the HKMG1 and the high-k dielectric 1402 can be a first type of electronic device (e.g., an n-type transistor or a p-type transistor), and the top electronic device 350 with the TANOS and the relatively thick gate dielectric 304 can be a second type of electronic device (e.g., a memory element 310) that is different from the first type of electronic device. The gate contact CB1 extends vertically through the TANOS and allows convenient contact through a sidewall of the TANOS, and the gate contact CB2 also extends vertically through the TANOS but is electrically isolated from the TANOS while allowing convenient contact to the HKMG1 through a top surface of the HKMG1. Additional details of how the top electronic device 350 and the bottom electronic device 360 can be fabricated are provided subsequently herein in connection with the description of the fabrication operations depicted in FIG. 4-16.

Figure 3B:
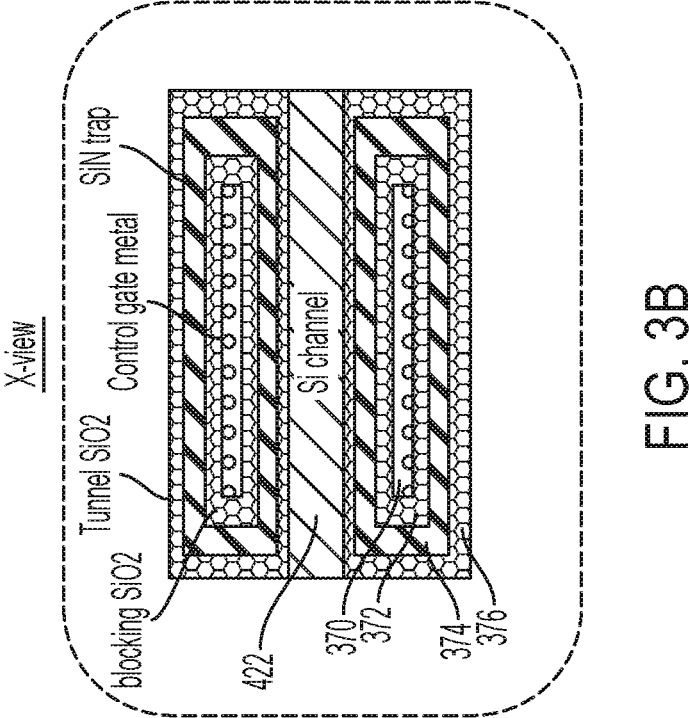
FIG. 3B depicts a cross-sectional view of a portion of the CFET architecture shown in FIG. 3A.

FIG. 3B depicts a cross-sectional view of an example of how the memory element 310 shown in FIG. 3A can be implemented as a memory element 310A. As shown the memory element 310A can be an embedded NOR Flash memory device having the Si nanosheet channel 422 surrounded by a multilayer gate element having the TANOS functioning as a control gate metal 370, a blocking layer 372 (e.g., $SiO_2$), a trap layer 374 (e.g., SiN), and a tunnel layer 376 (e.g., $SiO_2$), configured and arranged as shown. Flash memory is an electronic non-volatile computer memory storage medium that can be electrically erased and reprogrammed. The two main types of flash memory, NOR flash and NAND flash, are named for the NOR and NAND logic gates. Both use the same cell design, which can be a floating gate MOSFET. They differ at the circuit level depending on whether the state of the bit line or word lines is pulled high or low. In NAND flash memory, the relationship between the bit line and the word lines resembles a NAND gate, and in NOR flash memory, the relationship between the bit line and the word lines resembles a NOR gate.

FIGS. 4-16 depict multiple cross-sectional views (i.e., an X-view and a Y-view) of a stacked nanosheet-based structure 400 after various fabrication operations for forming the stacked device configuration 202 (shown in FIG. 2) having a CFET architecture, along with independent and electrically-isolated gate regions HKMG1 (with the high-k dielectric 1402) and HKMG2 (with the high-k dielectric 1402) (shown in FIG. 2) in accordance with aspects of the invention. Although FIGS. 4-16 focus on forming the stacked device configuration 202, virtually all of the operations depicted in FIGS. 4-16 can also be used to fabricate the stacked device configuration 302 (shown in FIG. 3A), the memory element 310 (shown in FIG. 3A), and the example memory element 310A (shown in FIG. 3B).

Figure 4:
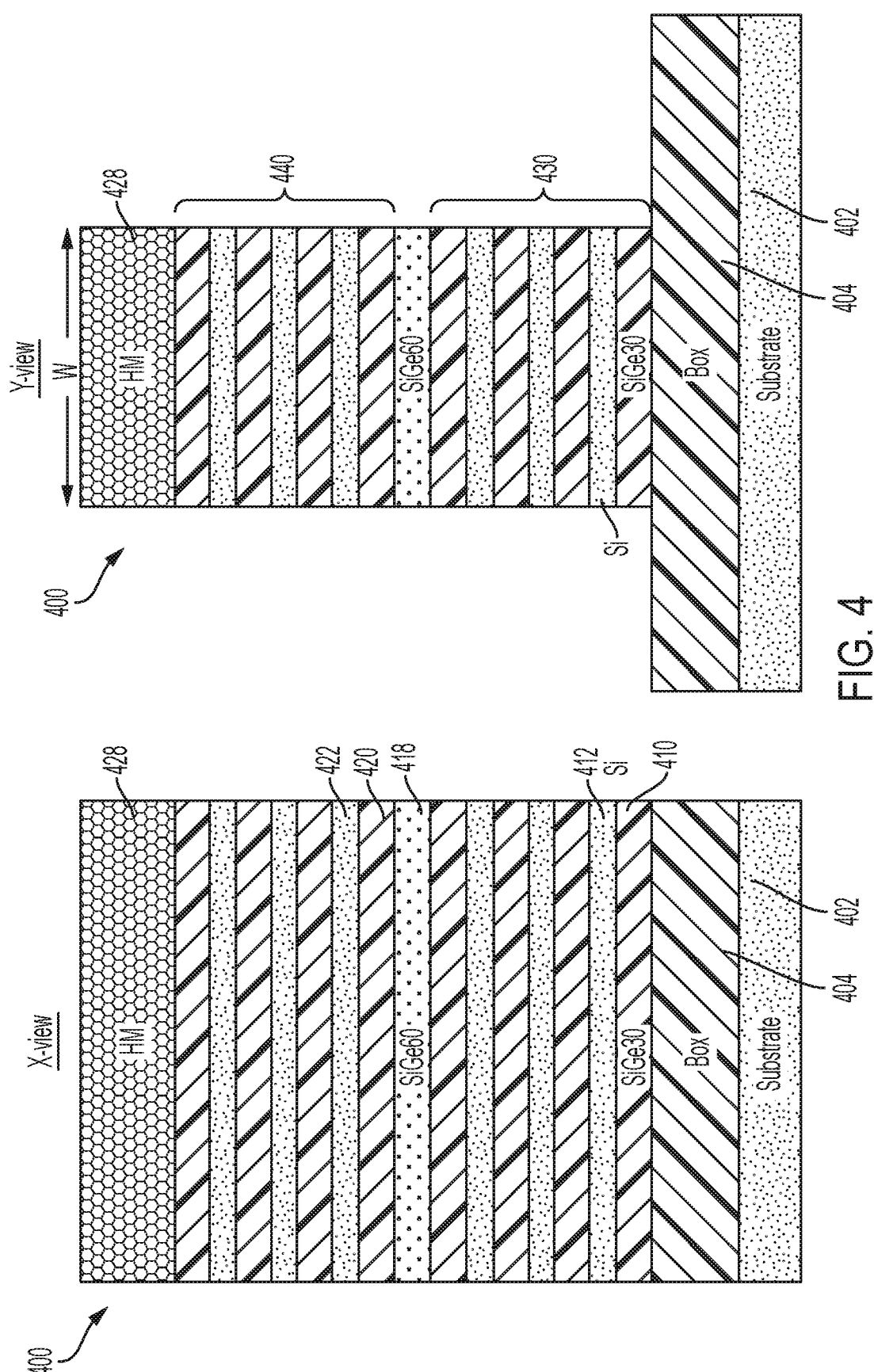

Turning initially to FIG. 4, there are depicted cross-sectional views of the stacked nanosheet-based structure 400 after initial fabrication operations in accordance with aspects of the present invention. As shown in FIG. 4, an initial wafer is formed that includes a substrate 402 and a buried insulator (BOX) layer 404 over the substrate 402. A bottom nanosheet stack 430 is over the BOX layer 404; a relatively thicker SiGe sacrificial nanosheet layer 418 is over the bottom nanosheet stack 430; and a top nanosheet stack 440 is formed over the relatively thicker SiGe sacrificial layer 418.

In embodiments of the invention, the substrate 402 can be a bulk configuration. The substrate 402 can be formed from silicon or it can be formed from materials other than silicon, e.g., silicon-germanium, a III-V compound semiconductor material, and the like. The BOX layer 404 can be an oxide such as $SiO_2$. The initial semiconductor layer above the BOX layer 404 can be a thin SiGe layer (not shown separately) or a Si layer that is later converted to a SiGe layer (e.g., SiGe layer 410) by SiGe epitaxy growth and SiGe condensation The terms "substrate" or "semiconductor substrate" should be understood to cover all semiconducting materials and all forms of such materials. Although the stacked nanosheet-based structure 400 illustrates an SOI (silicon on insulator) configuration (BOX layer 404 plus the substrate 402), embodiments of the inventions apply to any suitable starting substrate/wafer, such as bulk Si wafers, III-V wafers, and the like.

The bottom nanosheet stack 430 and the top nanosheet stack 440 each includes an alternating series of SiGe sacrificial nanosheet layers 410, 420 and Si nanosheet layers 412, 422. In accordance with aspects of the invention, the alternating nanosheet layers 410, 412, 420, 422 of the bottom and top nanosheet stacks 430, 440 are formed by epitaxially growing one nanosheet layer then the next until the desired number and desired thicknesses of the nanosheet layers are achieved. A hard mask layer (not shown) is deposited over the stacked nanosheet-based structure 400. The hard mask layer is patterned to define an elongated fin-shape profile for the stacked nanosheet-based structure 400 (best shown in the Y-view). The hard mask layer and the stacked nanosheet-based structure 400 are etched to define the elongated fin-shaped profile for the hard mask (HM) 428 (best shown in the Y-view), the bottom nanosheet stack 430 (best shown in the Y-view), the relatively thicker SiGe sacrificial nanosheet layer 418, and the top nanosheet stack 440 (best shown in the Y-view). In accordance with aspects of the invention, the width dimension (W) shown in the Y-view is greater than what is required by the IC design for the final stacked device configuration 202 (shown in FIG. 2). The hard mask layer and the resulting HM 428 can be formed from any suitable dielectric, including but not limited to SiN.

In embodiments of the invention, each of the nanosheet layers 410, 412, 420, 422 can have a vertical direction thickness in the range from about 5 nm to about 20 nm, in the range from about 10 nm to about 15 nm, or about 10 nm. Other vertical direction thicknesses are contemplated. Although fifteen (15) instances of the alternating nanosheet layers 410, 412, 418, 420, 422 are depicted in the figures, any number of alternating nanosheet layers can be provided.

As noted, epitaxial growth techniques can be used to form the alternating nanosheet layers 410, 412, 418, 420, 422 shown in FIG. 4. Epitaxial materials can be grown from gaseous or liquid precursors using, for example, vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on non-crystalline surfaces such as silicon dioxide or silicon nitride.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments of the invention, the SiGe sacrificial nanosheet layers 410, 420 can be about SiGe 25% or 30%. The notation "SiGe 25%" is used to indicate that 25% of the SiGe material is Ge and 75% of the SiGe material is Si. In some embodiments of the invention, the Ge percentage in the SiGe sacrificial nanosheet layers 410, 420 can be any value, including, for example a value within the range from about 20% to about 45%.

In accordance with aspects of the invention, the relatively thicker SiGe sacrificial nanosheet layer 418 that separates the bottom nanosheet stack 430 from the top nanosheet stack 440 can be about SiGe 60%. In embodiments of the invention, the relatively thicker SiGe sacrificial nanosheet layer 418 has a Ge percentage that is sufficiently greater than the Ge percentage in the SiGe sacrificial nanosheet layers 410, 420 to provide etch selectivity between the relatively thicker SiGe sacrificial nanosheet layer 418 and the remaining portions of the stacked nanosheet-based structure 400, including specifically the SiGe sacrificial nanosheet layers 410, 420. In some aspects of the invention, the Ge percentage in the relatively thicker SiGe sacrificial nanosheet layer 418 is above about 55%. In some aspects of the invention, the SiGe sacrificial nanosheet layers 410, 420 can be SiGe 25%, and the relatively thicker SiGe sacrificial nanosheet layer 418 can be at or above about SiGe 55% (e.g., about SiGe 60%).

Figure 5:
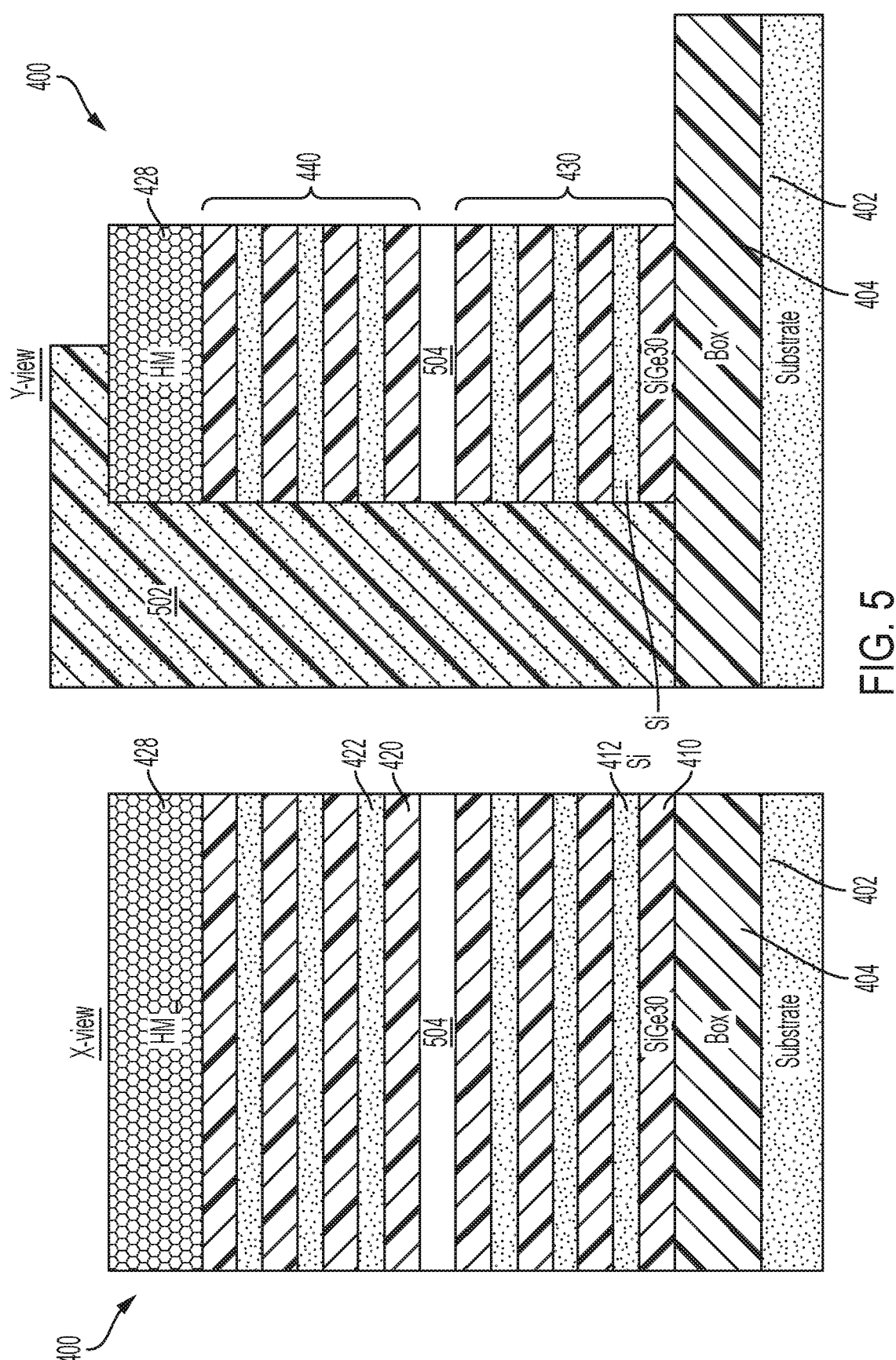

FIG. 5 depicts cross-sectional views of the stacked nanosheet-based structure 400 after known fabrication operations have been applied according to embodiments of the invention. A sacrificial anchoring layer 502 (best shown in the Y-view) is formed on the stacked nanosheet-based structure 400 and patterned to expose one side of the stacked nanosheet-based structure 400. The sacrificial anchoring layer 502 operates to secure the bottom nanosheet stack 430 and the top nanosheet stack 440 after the relatively thicker SiGe sacrificial nanosheet layer 418 (shown in FIG. 4) has been removed. The sacrificial anchoring layer 502 can be formed of titanium oxide (TiO$_x$). In embodiments of the invention, other example materials of the sacrificial anchoring layer 502 can include AlO$_x$, TiN, and the like. Subsequent to forming the sacrificial anchoring layer 502, a selective etch is performed to remove the relatively thicker SiGe sacrificial nanosheet layer 418 (shown in FIG. 4), thereby forming a cavity 504. An isotropic etch can be performed that is selective to remove the relatively thicker SiGe sacrificial nanosheet layer 418 while not removing the remaining portions of the stacked nanosheet-based structure 400, including specifically the SiGe sacrificial nanosheet layers 410, 420. An example etchant that selectively etches the relatively thicker SiGe sacrificial nanosheet layer 418 can include a vapor phase hydrogen chloride (HCl) at a suitable temperature and pressure.

Figure 6:
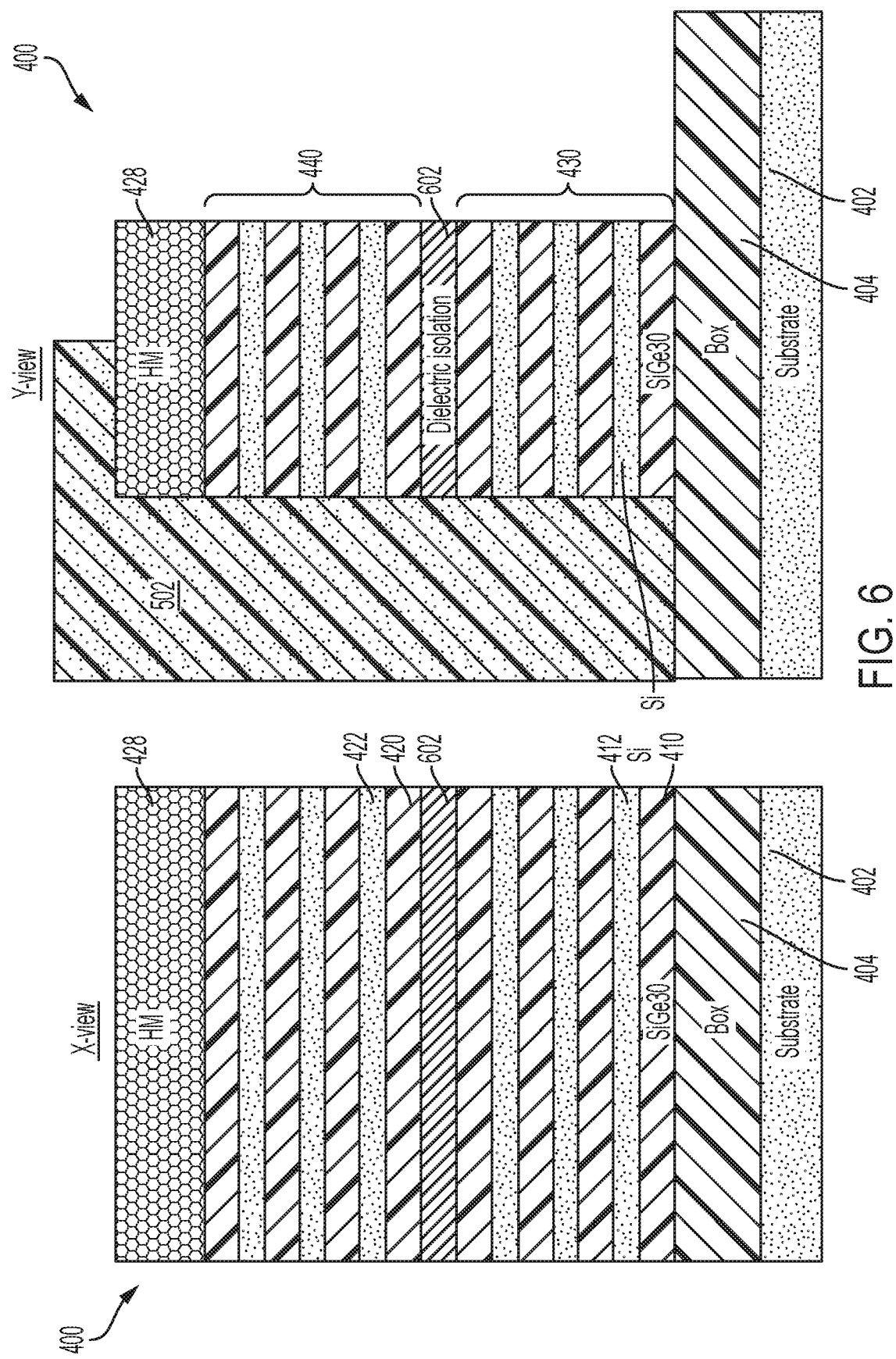

FIG. 6 depicts cross-sectional views of the stacked nanosheet-based structure 400 after known fabrication operations have been applied according to embodiments of the invention. A dielectric isolation layer 602 is formed to fill the cavity 504 (shown in FIG. 5). The dielectric isolation layer 602 provides dielectric isolation between the bottom nanosheet stack 430 and the top nanosheet stack 440. The dielectric isolation layer 602 can be deposited using ALD, CVD, or any other suitable deposition technique. Example materials of the dielectric isolation layer 602 can include silicon carbide (SiC), silicon carbon oxygen (SiCO), SiOCN, SiBCN, and the like. Any excess material of the dielectric isolation layer 602 can be removed by a suitable selective isotropic etching process.

Figure 7:
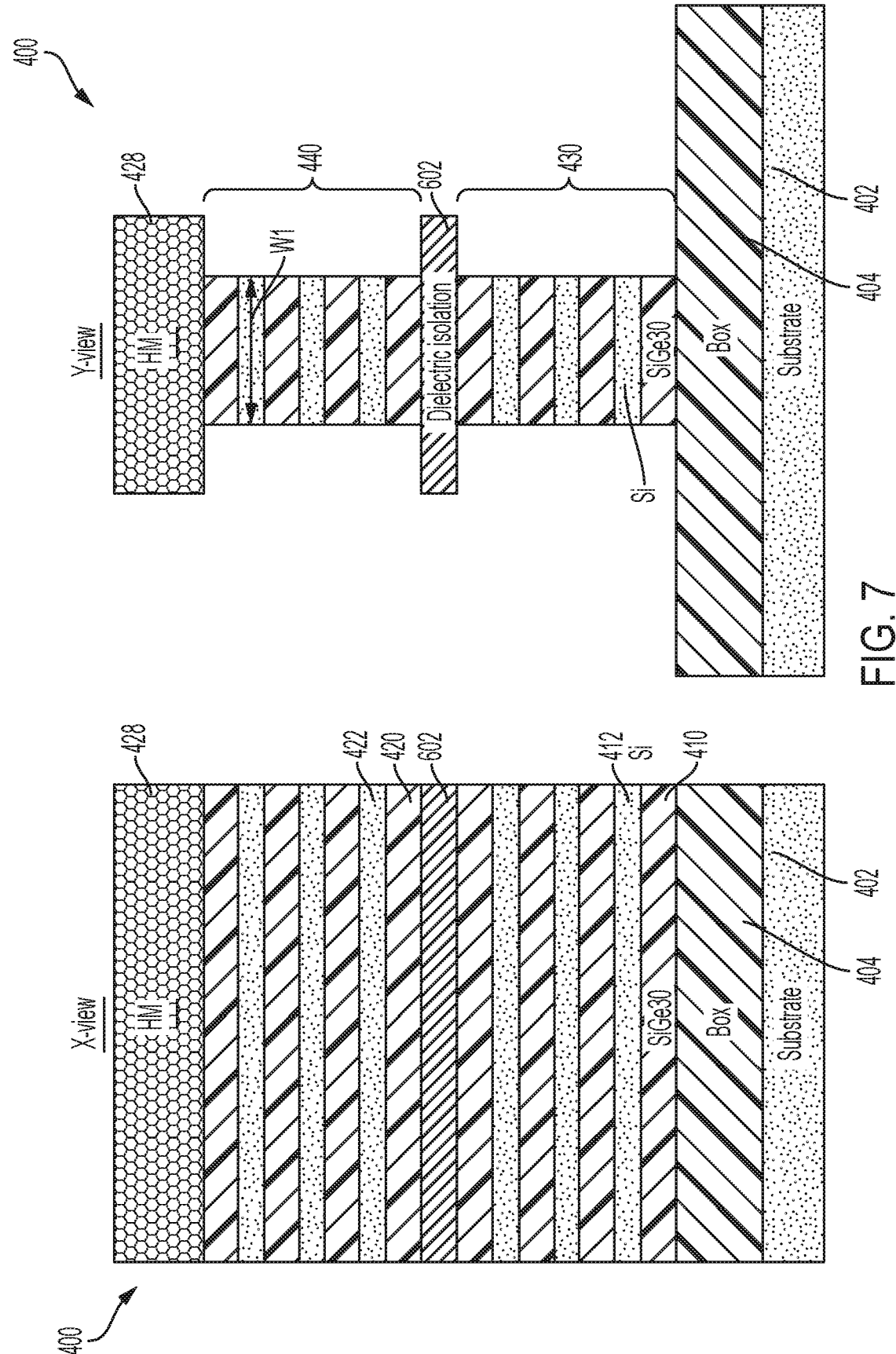

FIG. 7 depicts cross-sectional views of the stacked nanosheet-based structure 400 after known fabrication operations have been applied according to embodiments of the invention. More specifically, known fabrication operations (e.g., a wet or dry etch) has been used to remove the sacrificial anchoring layer 502 (shown in FIG. 5). Subsequently, the bottom nanosheet stack 430 and the top nanosheet stack 440 are each trimmed using a wet or dry etch to a new width dimension W1. For example, an isotropic etch can be used to selectively etch semiconductor material layers 410, 412, 420, 422 while not etching dielectric isolation layer 602. This results in dielectric isolation layer 602 have a greater width than semiconductor material layers 410, 412, 420, 422 in the Y-view. An example process that selectively etches semiconductor material layers 410, 412, 420, 422 can include a cyclic wet TMAH (tetramethylammonium hydroxide) and dry HCl etch process.

Figure 8:
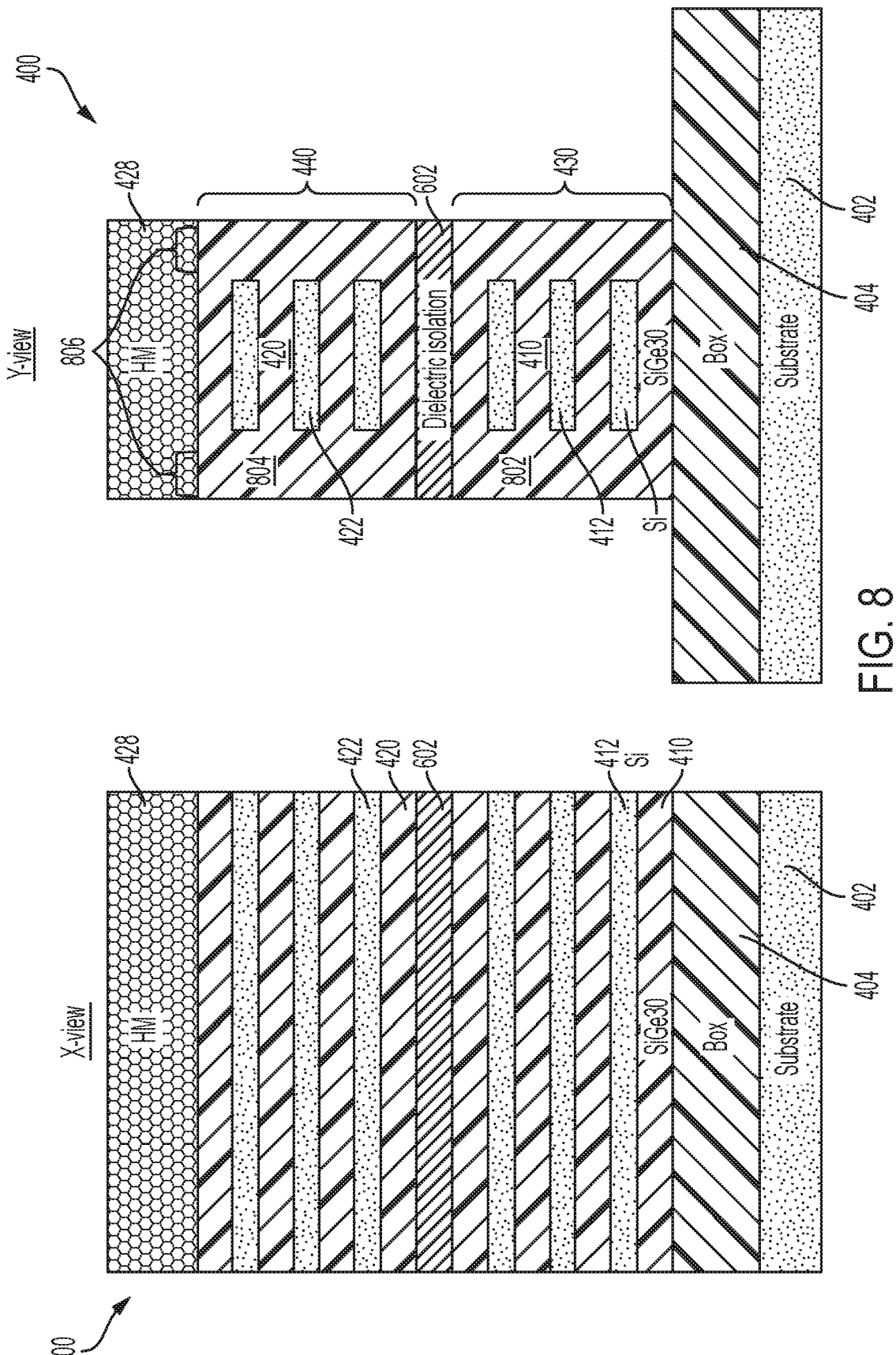

FIG. 8 depicts cross-sectional views of the stacked nanosheet-based structure 400 after known fabrication operations have been applied according to embodiments of the invention. More specifically, a conformal deposition of SiGe has been performed followed by an anisotropic reactive ion etch (RIE) to selectively remove any excess SiGe material not covered by the HM 428. This results in additional SiGe semiconductor material 806 formed from substantially vertical SiGe sacrificial layers 802, 804 formed on the sides of the substantially horizontal SiGe sacrificial nanosheets 410, 420. The deposited SiGe semiconductor material 806 is the same as the substantially horizontal SiGe sacrificial nanosheets 410, 420 such that the materials 410, 420, 802, 804, 806 can be etched selectively.

Figure 9:
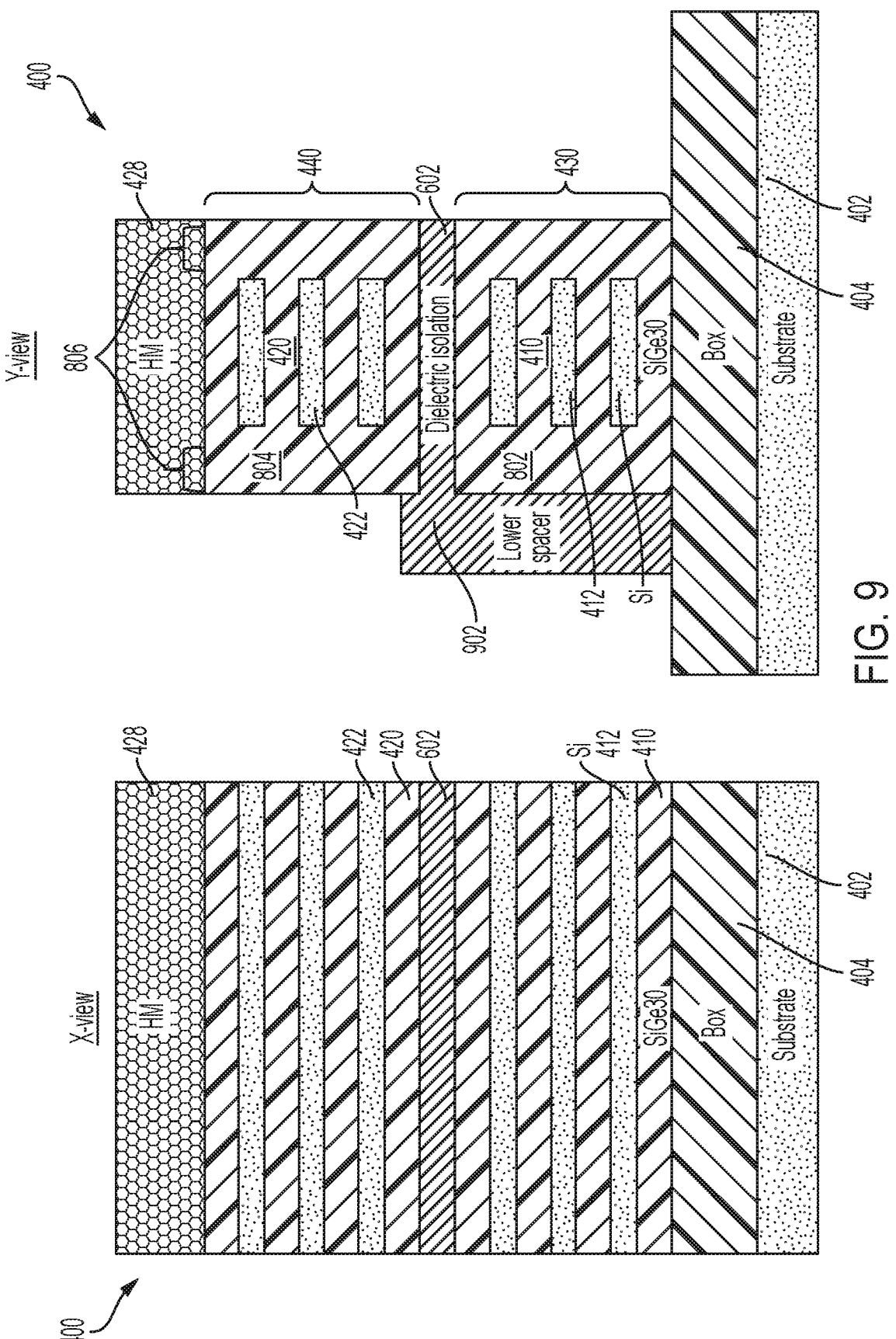

FIG. 9 depicts cross-sectional views of the stacked nanosheet-based structure 400 after known fabrication operations have been applied according to embodiments of the invention. More specifically, lithography processes are performed to form a lower spacer 902 on the sides of the substantially vertical SiGe sacrificial layers 802, 804 and the dielectric isolation layer 602. To form the lower spacer 902, a conformal layer deposition of spacer material is formed on the nanosheet-based structure 400 and an anisotropic etch (e.g., RIE) is performed to recess the spacer material resulting in the lower spacer 902. In aspects of the invention, the lower spacer 902 is recessed to a height above the dielectric isolation layer 602. Subsequently, a mask (e.g., an organic patterning layer (OPL), not shown) is formed and patterned on one side of bottom and top nanosheet stacks 430, 440 while the side of the bottom and top nanosheet stacks 430, 440 where lower spacer 902 is formed remains covered by the mask, which allows the exposed lower spacer to be selectively removed by wet or dry etch process, leaving the lower spacer 902. The lower spacer 902 can be formed from a suitable dielectric such as SiN, SiBCN, SiC, SiOC, and the like.

Figure 10:
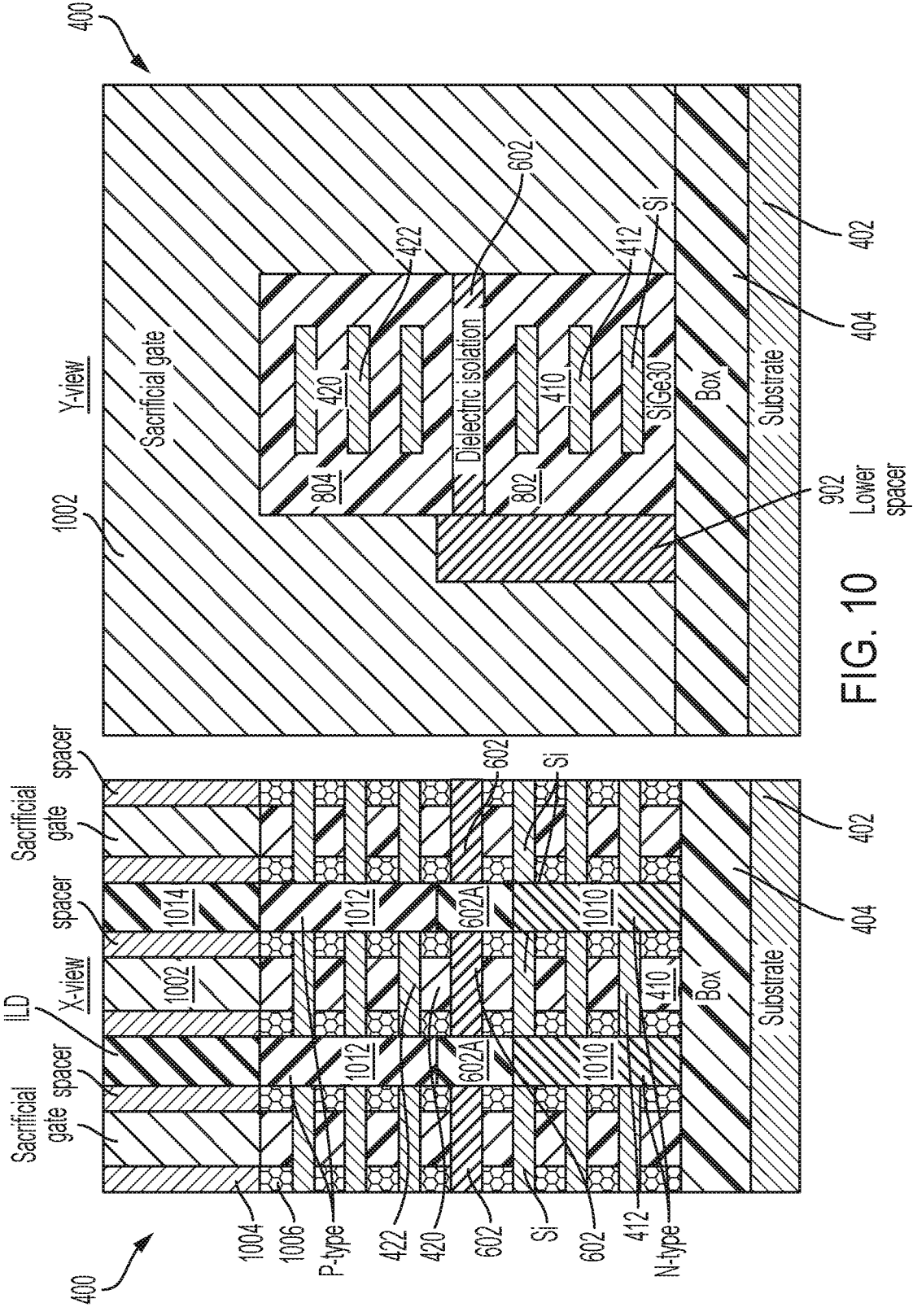

FIG. 10 depicts cross-sectional views of the stacked nanosheet-based structure 400 after known fabrication operations have been applied according to embodiments of the invention. More specifically, the HM 428 has been stripped away, and multiple known fabrication operations have been used to form sacrificial gates 1002, gate spacers 1004, inner spacers 1006, n-type doped S/D regions 1010, replacement dielectric isolation regions 602A, p-type doped S/D regions 1012, and interlayer dielectric (ILD) regions 1014, configured and arranged as shown. A variety of techniques are available to form these structures, and such techniques are well-known to those skilled in the relevant arts. Accordingly, specific illustrations and detailed descriptions of examples of such fabrication techniques have not been provided in the interest of brevity, and instead, the following summary descriptions of the structures formed in FIG. 10 is provided.

Referring still to FIG. 10, known fabrication operations have been used to, prior to formation of the sacrificial gates 1002, deposit a thin layer of gate oxide (not shown separately) over the bottom and top nanosheet stacks 430, 440. As shown in FIG. 10, the sacrificial gates 1002 represent the combination of the thin layer of gate oxide (e.g., SiO$_2$) and a material (e.g., amorphous silicon (a-Si)) from which the sacrificial gates 1002 are formed. Known fabrication operations (e.g., an RIE) can be used to form the sacrificial gates 1002. In embodiments of the invention, the sacrificial gates 1002 can be formed by depositing and planarizing a layer of sacrificial gate material (not shown) over the gate oxide (not shown separately from the topmost SiGe sacrificial nanosheet 420). In some embodiments of the invention, the sacrificial gate material can be polycrystalline Si. In some embodiments of the invention, the sacrificial gate material can be amorphous Si (a-Si).

Referring still to FIG. 10, known fabrication operations have been used to deposit and etch dielectric material to form offset gate spacers 1004 on sidewalls of the sacrificial gates 1002. In embodiments of the invention, the offset gate spacers 1004 can be formed from any suitable dielectric material including, for example, silicon oxide, silicon nitride, silicon oxynitride, SiBCN, SiOCN, SiOC, or any suitable combination of those materials. In some embodiments of the invention, the offset gate spacers 1004 can be a low-k dielectric material.

Referring still to FIG. 10, the portions of the bottom and top nanosheet stacks 430, 440 that are not covered by the offset gate spacers 1004 and the sacrificial gates 1002 are etched, thereby forming two (2) trenches that each extends through the top nanosheet stack 440, the dielectric isolation 602, and the bottom nanosheet stack 430, and further forming multiple instances of the bottom and top nanosheet stacks 430, 440. The trenches provide access to end regions of the Si nanosheets 412, 422. The right-most and left-most instances of the bottom and top nanosheet stacks 430, 440 can each be part of an active or inactive electronic device (e.g., a transistor) depending on the requirements of the IC design in which the stacked nanosheet-based structure 400 will be incorporated. Where the right-most and/or left-most instances of the bottom and top nanosheet stacks 430, 440 is part of an active transistor, the active transistor formed from right-most and/or left-most bottom and top nanosheet stacks 430, 440 will be in series with the transistor formed from the center instances of the bottom and top nanosheet stacks 430, 440 and will share a S/D drain region with the transistor formed from the center instances of the bottom and top nanosheet stacks 430, 440. Whether or not the transistors formed from the right-most and left-most instances of the top and bottom nanosheet stacks 430, 440 are active, the right-most and left-most instances of the bottom and top nanosheet stacks 430, 440 define portions of the previously described trenches in which the n-type doped S/D regions 1010, the replacement dielectric isolation regions 602A, the p-type doped S/D regions 1012, and the ILD regions 1014 will be formed.

Referring still to FIG. 10, subsequent to forming the above-described trenches, but prior to forming the n-type doped S/D regions 1010, the replacement dielectric isolation regions 602A, the p-type doped S/D regions 1012, and the ILD regions 1014, known semiconductor fabrication processes are used to partially remove end regions of the SiGe sacrificial nanosheets 410, 420 to form end region or inner spacer cavities in which the inner spacers 1006 are formed. The inner spacers 1006 can be silicon nitride, silicoboron carbonitride, silicon carbonitride, silicon carbon oxynitride, or any other type of dielectric material (e.g., a dielectric material having a dielectric constant k of less than about 5). Subsequent to forming the inner spacers 1006, known fabrication operations are used to form the n-type doped S/D regions 1010 in the previously-described trenches. In embodiments of the invention, an epitaxial growth process can be used to grow the n-type doped S/D regions 1010 from exposed ends of the Si nanosheets 412. In embodiments of the invention, the n-type doped S/D regions 1010 can be epitaxially grown from gaseous or liquid precursors using, for example, vapor-phase epitaxy (VPE), molecular-beam epitaxy (MBE), liquid-phase epitaxy (LPE), or other suitable process. In embodiments of the invention, the n-type doped S/D regions 1010 can be doped during deposition (e.g., in-situ doped) by adding dopants such as n-type dopants (e.g., phosphorus or arsenic) during the above-described methods of forming the n-type doped S/D regions 1010.

Referring still to FIG. 10, subsequent to forming the n-type doped S/D regions 1010, the replacement dielectric isolation region 602A is formed to replace the portions of the dielectric isolation region 602 that was removed during formation of the previously-described trenches. Example materials of the replacement dielectric isolation regions 602A can include silicon carbide (SiC), silicon carbon oxygen (SiCO), SiOCN, SiBCN, and the like. In embodiments of the invention, the dielectric isolation region 602 and the replacement dielectric isolation regions 602A can be the same or different material. Subsequent to formation of the replacement dielectric regions 602A, known fabrication operations are used to form the p-type doped S/D regions 1012 in the previously-described trenches. In embodiments of the invention, an epitaxial growth process can be used to grow the p-type doped S/D regions 1012 from exposed ends of the Si nanosheets 422. In embodiments of the invention, the p-type doped S/D regions 1012 can be epitaxially grown from gaseous or liquid precursors using, for example, vapor-phase epitaxy (VPE), molecular-beam epitaxy (MBE), liquid-phase epitaxy (LPE), or other suitable process. In embodiments of the invention, the p-type doped S/D regions 1012 can be doped during deposition (e.g., in-situ doped) by adding dopants such as p-type dopants (e.g., Ga, B, $BF_2$, or Al) during the above-described methods of forming the p-type doped S/D regions 1012. Subsequent to forming the p-type doped S/D regions 1012, known semiconductor device fabrication processes are used to deposit ILD regions 1014 to fill in remaining open spaces of the previously-described trenches and stabilize the stacked nanosheet-based structure 400. In aspects of the invention, the ILD regions 1014 can be formed from a low-k dielectric (e.g., k less than about 4) and/or an ultra-low-k (ULK) dielectric (e.g., k less than about 2.5). The nanosheet-based structure 400 is then planarized to a predetermined level to prepare the nanosheet-based structure 400 for downstream processing.

Figure 11:
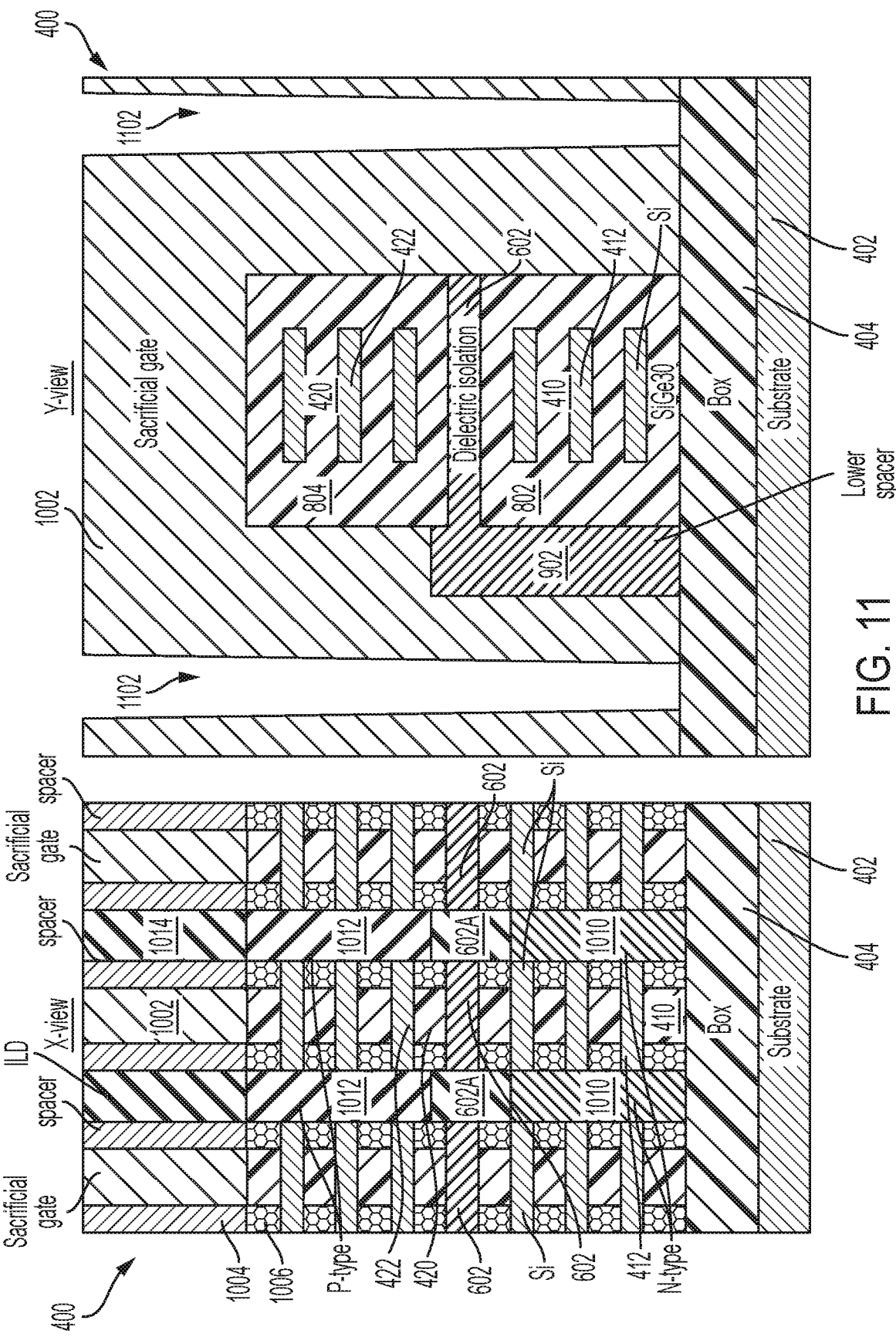

FIG. 11 depicts cross-sectional views of the stacked nanosheet-based structure 400 after known fabrication operations have been applied according to embodiments of the invention. More specifically, etching is applied to the sacrificial gates 1002 to form a full height cut in the sacrificial gate structures 1002 resulting in gate cut opening 1102. The gate cut openings 1102 extend through the full or entire height of sacrificial gate structures 1002, thereby exposing a top surface of the BOX layer 404 underneath.

Figure 12:
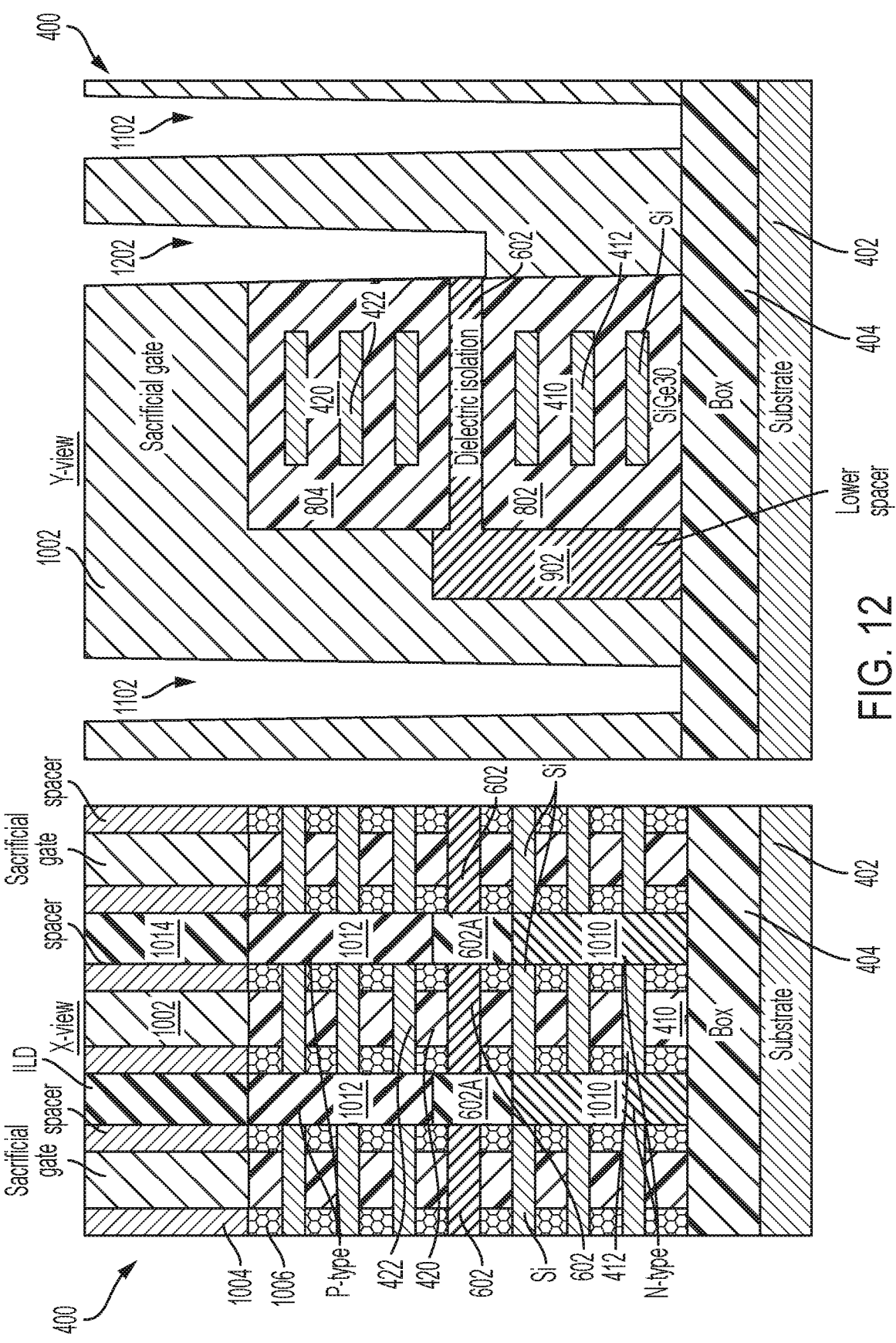

FIG. 12 depicts cross-sectional views of the stacked nanosheet-based structure 400 after known fabrication operations have been applied according to embodiments of the invention. More specifically, etching is performed to form a less than full height cut in the sacrificial gate structures 1002 resulting in gate cut opening 1102. The gate cut opening 1102 cuts through part (e.g., at least about half) of the sacrificial gate structures 1002, thereby exposing an end surface of the dielectric isolation layer 602.

Figure 13:
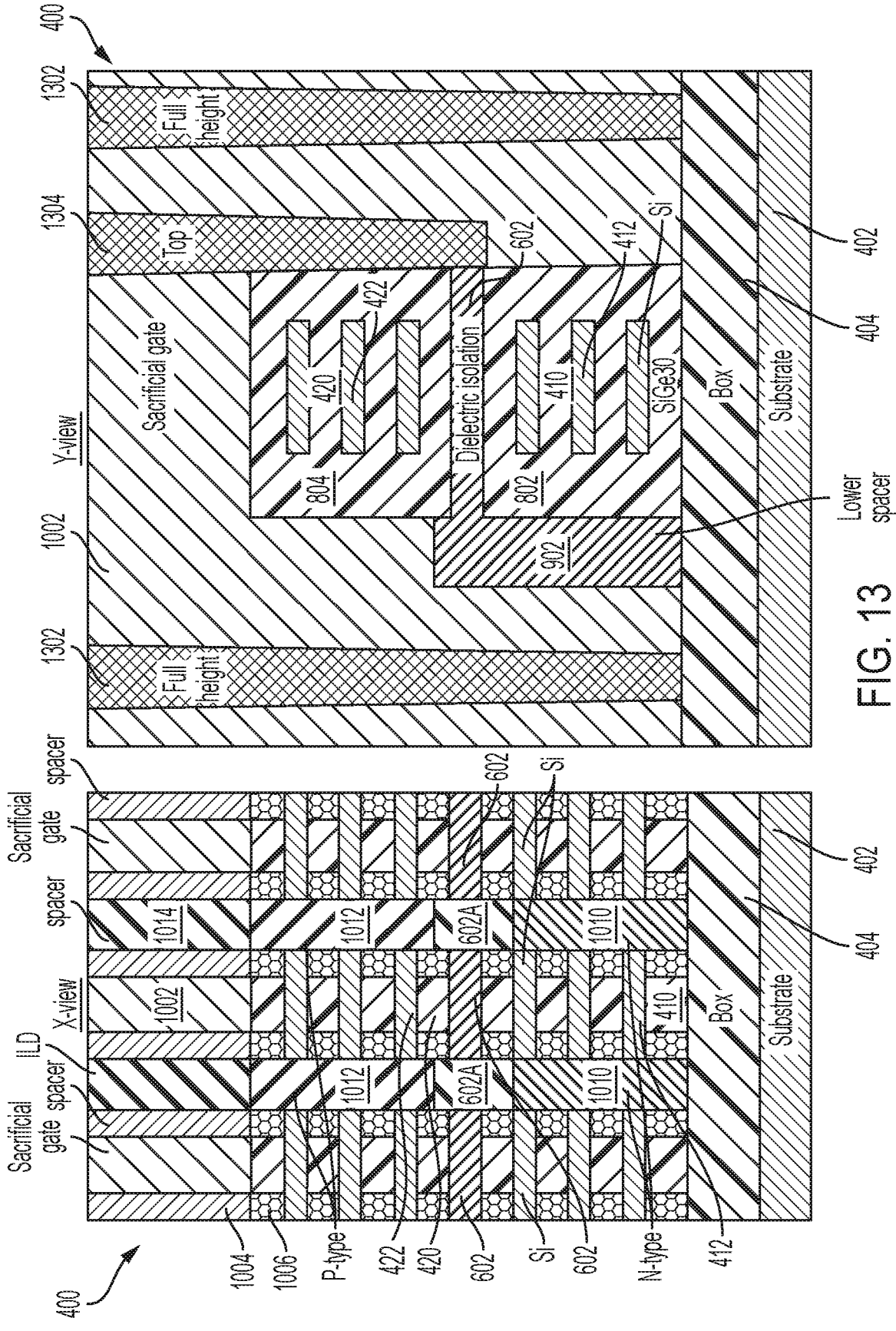

FIG. 13 depicts cross-sectional views of the stacked nanosheet-based structure 400 after known fabrication operations have been applied according to embodiments of the invention. More specifically, dielectric material is deposited to fill the gate cut openings 1102, 1202 (shown in FIG. 12) then recessed (e.g., using CMP) to the level shown in FIG. 13 to form the full height vertical dielectric layers 1302 and the top vertical dielectric layer 1304. A bottom surface of full height vertical dielectric layers 1302 abuts the BOX layer 404 underneath. A side surface of the top vertical dielectric layer 1304 abuts the end surface of dielectric isolation layer 602. Example dielectric materials for the full height vertical dielectric layers 1302 and the top vertical dielectric layer 1304 include SiN, SiBCN, SiOCN, SiOC, SiC, and the like. In embodiments of the invention, different dielectric materials can be utilized for full height vertical dielectric layers 1302 and top vertical dielectric layer 1304.

Figure 14:
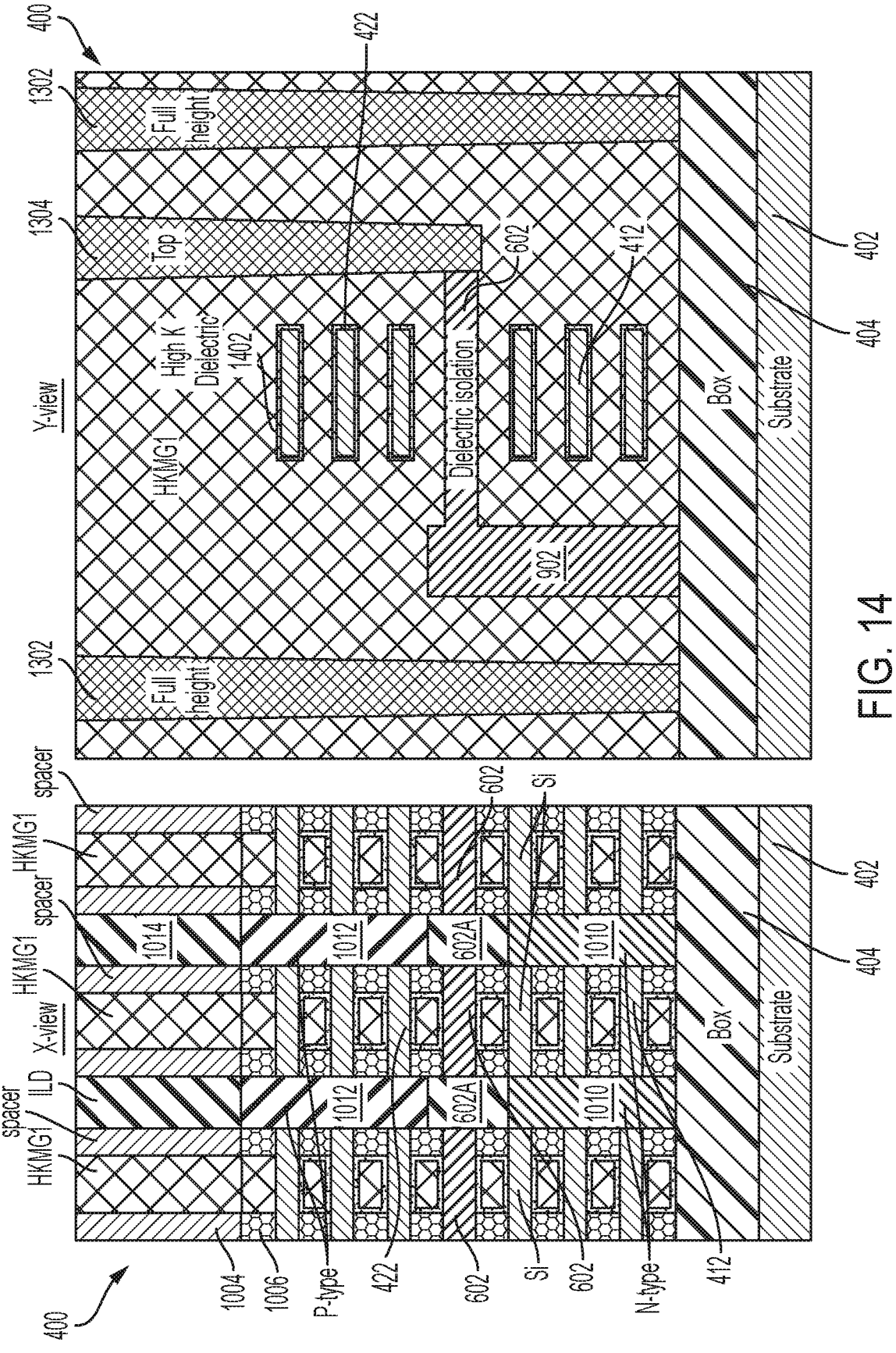

FIG. 14 depicts cross-sectional views of the stacked nanosheet-based structure 400 after known fabrication operations have been applied according to embodiments of the invention. More specifically, known semiconductor fabrication operations have been used to remove the SiGe sacrificial nanosheets 410, 420 (shown in FIG. 13) and the sacrificial gates 1002 (shown in FIG. 13). The sacrificial gates 1002 and the gate dielectric (not shown) can be removed by suitable known etching processes, e.g., RIE or wet removal processes. Known semiconductor fabrication operations can be used to remove the SiGe sacrificial nanosheets 410, 420 selective to the Si nanosheets 412, 422. In embodiments of the invention, because the SiGe sacrificial nanosheets 410, 420 are formed from SiGe, they can be selectively etched with respect to the Si nanosheets 412, 422 using, for example, a vapor phase HCL gas isotropic etch process. After the fabrication operations depicted in FIG. 14, the bottom nanosheet stack 430 (shown in FIG. 9) no longer includes the SiGe sacrificial nanosheets 410 and the substantially vertical SiGe sacrificial layers 802; and the top nanosheet stack 440 (shown in FIG. 9) no longer includes the SiGe sacrificial nanosheets 420 and the substantially vertical SiGe sacrificial layers 804.

Referring still to FIG. 14, the spaces that were occupied by the SiGe sacrificial nanosheets 410, 420 (shown in FIG. 13) and the sacrificial gates 1002 (shown in FIG. 13) are filled by a multi-segmented HKMG gate stack structure identified in FIG. 14 as HKMG1, along with a high-k dielectric 1402. The HKMG1 can include a primary metal region having a work function metal (WFM) (not shown separately), and the high-k dielectric 1402 can be a relatively thin (e.g., from about 0.7 nm to about 3 nm) high-k gate dielectric (e.g., hafnium oxide) (not shown separately). The HKMG1 and the high-k dielectric 1402 extend into open regions around the bottom nanosheet stacks 430 and the top nanosheet stacks 440 to surround the Si nanosheets 412, 422. The portion of the HKMG1 and the high-k dielectric 1402 around the bottom nanosheet stacks 430 is considered non-sacrificial, and the portion of the HKMG1 and the high-k dielectric 1402 around the top nanosheet stacks 440 is considered sacrificial and will be replaced in subsequent fabrication operations in accordance with aspects of the invention to provide independent and electrically isolated gate regions for the bottom nanosheet stack 430 and the top nanosheet stack 440, respectively. The portion of the HKMG1 and the high-k dielectric 1402 that is around the bottom nanosheet stack 430 will be part of the final regulates electron flow through the Si nanosheets 412.

Referring still to FIG. 14, the primary metal region of the HKMG1 can be formed of any suitable conducting material, including but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The primary metal region can further include dopants that are incorporated during or after deposition.

Examples of suitable materials for the high-k dielectric 1402 associated with the HKMG1 include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric 1402 can further include dopants such as lanthanum, aluminum, magnesium. In some embodiments of the invention, the high-k dielectric 1402 can further include silicon oxide, silicon nitride, silicon oxynitride, or any suitable combination of those materials with high-k dielectric material. In embodiments of the invention, a function performed by the high-k dielectric 1402 between the Si nanosheets 412, 422 and the primary gate metal region of the HKMG1 is to prevent shorting.

In embodiments of the invention, the WFM layers of the primary metal region of the HKMG1 can be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides).

Figure 15:
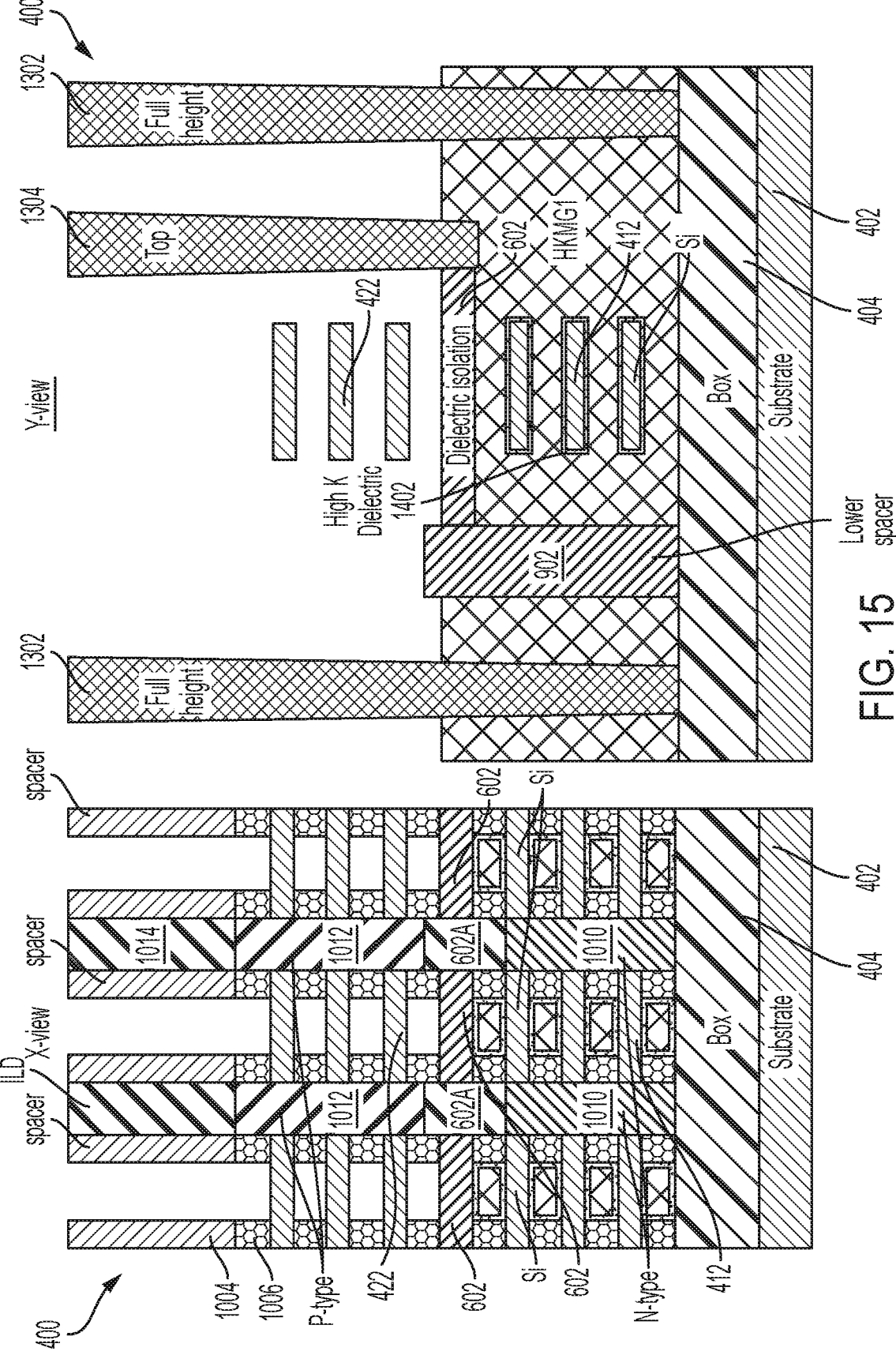

FIG. 15 depicts cross-sectional views of the stacked nanosheet-based structure 400 after known fabrication operations have been applied according to embodiments of the invention. More specifically, known semiconductor fabrication operations have been used to recess and/or remove the HKMG1 and the high-k dielectric 1402 from the upper regions of the nanosheet-based structure 400, and more particularly from regions around the top nanosheet stack 440.

Figure 16:
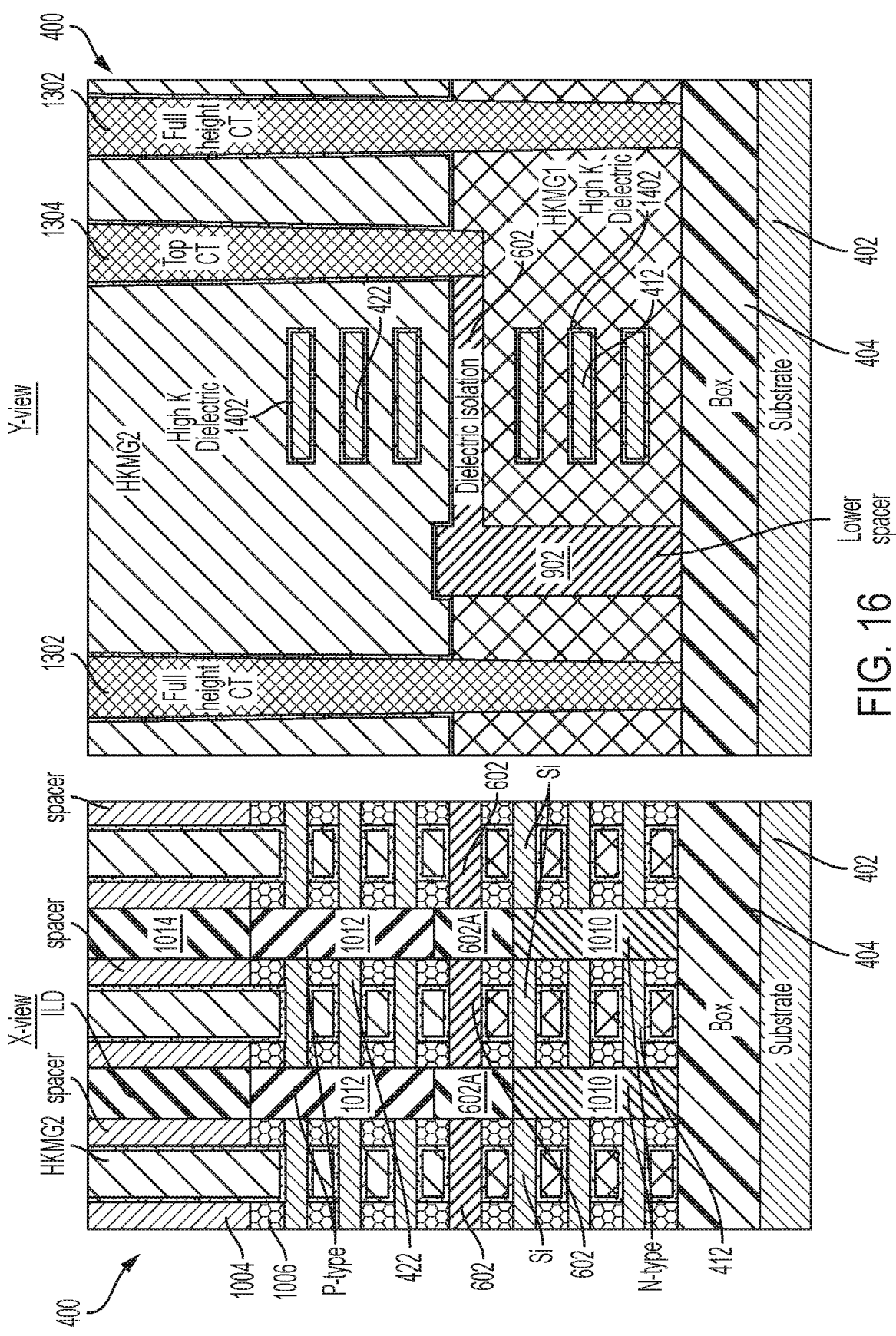

FIG. 16 depicts cross-sectional views of the stacked nanosheet-based structure 400 after known fabrication operations have been applied according to embodiments of the invention. More specifically, the spaces that were occupied by the recessed and removed portions of the HKMG1 and the high-k dielectric 1402 have been filled by a multi-segmented HKMG gate stack structure identified in FIG. 16 as HKMG2, along with the high-k dielectric 1402. The HKMG2 can include a primary metal region and a work function metal (WFM) (not shown separately), and the high-k dielectric 1402 includes a relatively thin (e.g., from about 0.7 nm to about 3 nm) high-k gate dielectric material (e.g., hafnium oxide). The HKMG2 and the high-k dielectric liner 1402 include substantially the same general features and functionality previously described for the HKMG1 and the high-k dielectric 1402, except the materials of the HKMG2 and the high-k dielectric liner 1202 (specifically the WFM) can be different from the HKMG1 and the high-k dielectric 1402. Accordingly, the combination of the bottom nanosheet stack 430 (after release of the SiGe sacrificial nanosheets 410) with the HKMG1 and the high-k dielectric 1402 can be a first type of electronic device (e.g., an n-type transistor), and the combination of the top nanosheet stack 440 (after release of the SiGe sacrificial nanosheets 420) with the HKMG2 and the high-k dielectric 1402 can be a second type of electronic device (e.g., a p-type transistor, or a memory element) that is different from the first type of electronic device.

Subsequent to the fabrication operations depicted in FIG. 16, known semiconductor operations are used to form the final stacked device configuration 202 shown in FIG. 2. More specifically, known semiconductor operations have been used to deposit a layer of ILD 210 over the nanosheet-based structure 400. Subsequently, known semiconductor fabrication operations are used to form a first contact trench extending through the ILD 210, the HKMG2, and a portion of the high-k dielectric 1402, thereby exposing a top surface of the lower spacer 902. The configuration of the gate contact CB1 provides one path for current flow through the contact CB1, which is at the interface between the gate contact CB1 and a sidewall surface that extends along a height dimension of the HKMG2. Similarly, known semiconductor fabrication operations are used to form a second contact trench extending through the ILD 210, the HKMG2, and a portion of the high-k dielectric 1402, thereby exposing a top surface of the HKMG1. A gate contact isolation liner 320, which can be formed from a dielectric material (e.g., $SiO_2$, high K, SiN), is deposited on sidewalls of the second contact trench, and a gate contact CB2 is formed in the remaining volume of the second contact trench such that a bottom surface of the gate contact CB2 lands on the exposed top surface of the HKMG1. The configuration of the gate contact CB2 provides one path for current flow through the contact CB2, where the one path is at the interface between the gate contact CB2 and the top surface of the HKMG1. Accordingly, CB1 provides the gate contact to the HKMG2, and CB2 provides the gate contact to the HKMG1.

In addition to the gate contacts CB1/CB2, S/D contacts (also known as CA contacts) are provided for the n-type doped S/D regions 1010, as well as the p-type doped S/D regions 1012. The S/D contacts for the n-type doped S/D regions 1010 and the p-type doped S/D regions 1012 can be formed in substantially the same way. However, for ease of illustration and explanation, only the S/D contacts 220 for the p-type doped S/D regions 1012 are depicted in FIG. 2. The S/D contacts 220 can be formed by forming trenches extending through the ILD 210 and the ILD 1014, where each trench is sized such that sidewalls of the trenches are ILD material and top surfaces of the p-type doped S/D regions 1012 are exposed. The remaining volume of the trenches is filled with the S/D contacts 220 such that bottom surfaces of the S/D contacts 220 land on the exposed top surfaces of the p-type doped S/D regions 1012. In some embodiments of the invention, the S/D contacts 220 can be formed from conductive material (e.g., a trench silicide), and the material that forms the S/D contacts 220 can be deposited using, for example, a chemical/electroplating process. In some embodiments of the invention, the S/D contacts 220 include a liner/barrier (not shown separately) deposited on sidewalls of the trenches prior to deposition of the conductive material of the S/D contacts 220.

In embodiments of the invention, the fabrication operations depicted in FIGS. 4 through 16 can be used as a base process for fabricating a variety of devices that can be formed through using the bottom nanosheet stack 430 and the top nanosheet stack 440 as the base platform for the devices. As an example, substantially the same fabrication operations shown in FIGS. 4-16 can be used to form the bottom nanosheet stack 430 into a switching-based electronic device (e.g., a p-type or n-type transistor operable to perform logic operations), and to form the top nanosheet stack 440 into a storage-based device (e.g., a memory device operable to perm storage operations). A non-limiting example is the final stacked device configuration 302 shown in FIG. 3A, along with the example memory elements 310, 310A shown in FIGS. 3A, 3B, both of which are previously described herein.

Accordingly, it can be seen from the foregoing detailed description that embodiments of the invention provide technical benefits and technical effects. For example, embodiments of the invention provide an IC that includes a stacked device configuration having a top electronic device positioned over a bottom electronic device, along with an isolation region operable to electrically isolate at least a gate region of the top electronic device from at least a gate region of the bottom electronic device. The gate region of the top electronic device includes a first conductive material, and the gate region of the bottom electronic device includes a second conductive material that is different from the first conductive material.

The above-described embodiments of the invention provide technical benefits and technical effects. For example, because the first conductive material is different from the second conductive material, the gate region of the top electronic device can be provided with different characteristics than the gate region of the bottom electronic device. Additionally, because the gate region of the top electronic device can be provided with different characteristics than the gate region of the bottom electronic device, the top electronic device can be a first type of electronic device, and the bottom electronic device can be a second type of electronic device that is different from the first type of electronic device. The ability to mix and match different types of electronic devices in the stacked device configuration provides improved flexibility in generating the design and floorplan of the IC.

In addition to one or more of the features described above, or as an alternative to any of the foregoing embodiments, a work function of the first conductive material is different from a work function of the second conductive material.

The above-described embodiments of the invention provide technical benefits and technical effects. For example, because the first conductive material is different from the second conductive material, the work function of the first conductive material can be different from the work function of the second conductive material, which enables the implementation of a type of the top electronic device that requires a different work function than the type of the bottom electronic device. The ability to mix and match different types of electronic devices in the stacked device configuration provides improved flexibility in generating the design and floorplan of the IC.

In addition to one or more of the features described above, or as an alternative to any of the foregoing embodiments of the invention, the top electronic device includes a p-type transistor, and the bottom electronic device includes an n-type transistor. Alternatively, the top electronic device includes an n-type transistor, and the bottom electronic device includes a p-type transistor.

The above-described embodiments of the invention provide technical benefits and technical effects. For example, because the top electronic device can be a first type of electronic device, and the bottom electronic device can be a second type of electronic device that is different from the first type of electronic device, this feature facilitates providing the first type of electronic device as a p-type transistor and providing the second type of electronic device as an n-type transistor. Alternatively, this feature also facilitates providing the first type of electronic device as an n-type transistor and providing the second type of electronic device as a p-type transistor. The ability to mix and match different types of electronic devices in the stacked device configuration provides improved flexibility in generating the design and floorplan of the IC.

In addition to one or more of the features described above, or as an alternative to any of the foregoing embodiments, the top electronic device includes a memory device operable to perform storage operations; and the bottom electronic device includes a transistor operable to perform logic operations.

The above-described embodiments of the invention provide technical benefits and technical effects. For example, because the top electronic device can be a first type of electronic device, and the bottom electronic device can be a second type of electronic device that is different from the first type of electronic device, this feature facilitates providing the first type of electronic device as a memory device operable to perform storage operations, and providing the second type of electronic device as transistor operable to perform logic operations. The ability to mix and match different types of electronic devices in the stacked device configuration provides improved flexibility in generating the design and floorplan of the IC.

In addition to one or more of the features described above, or as an alternative to any of the foregoing embodiments, a portion of the first gate contact structure is electrically coupled to the gate region of the top electronic device through a sidewall of the gate region of the top electronic device.

The above-described embodiments of the invention provide technical benefits and technical effects. For example, providing an electronic connection through a sidewall of the gate region of the top electronic device to a portion of the first gate contact structure provides a relatively large interface between the sidewall of the gate region of the top electronic device and the portion of the first gate contact structure, thereby providing decreased contact resistance.

In addition to one or more of the features described above, or as an alternative to any of the foregoing embodiments, the first gate contact structure is electronically isolated except for the portion of the first gate contact structure that is electrically coupled through the sidewall of the gate region of the top electronic device.

The above-described embodiments of the invention provide technical benefits and technical effects. For example, isolation of the first gate contact structure ensure that the only path for current to flow from the first gate contact structure is through the portion of the portion of the first gate structure that is electrically connected to the sidewall of the gate region of the top electronic device, thereby further providing decreased contact resistance.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

The term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

References in the specification to terms such as "vertical," "horizontal," "lateral," etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit (IC) comprising:
a stacked device configuration comprising a top electronic device positioned over a bottom electronic device;
an isolation region between the top electronic device and the bottom electronic device; and
a first gate contact structure electrically coupled to a gate region of the top electronic device;
wherein a bottom surface of the first gate contact structure is on a portion of the isolation region;
wherein the gate region of the top electronic device comprises a top gate dielectric layer; and
wherein the first gate contact structure extends through the top gate dielectric layer to allow the bottom surface of the first gate contact structure to be on the portion of the isolation region.

2. The IC of claim 1, wherein:
the gate region of the top electronic device comprises a first conductive material;
the gate region of the bottom electronic device comprises a second conductive material; and
a work function of the first conductive material is different from a work function of the second conductive material.

3. The IC of claim 2, wherein:
the top electronic device comprises a p-type transistor; and
the bottom electronic device comprises an n-type transistor.

4. The IC of claim 2, wherein:
the top electronic device comprises an n-type transistor; and
the bottom electronic device comprises a p-type transistor.

5. The IC of claim 2, wherein:
the top electronic device comprises a memory device operable to perform storage operations; and the bottom electronic device comprises a transistor operable to perform logic operations.

6. The IC of claim 1, wherein a portion of the first gate contact structure is electrically coupled to the gate region of the top electronic device through a sidewall of the gate region of the top electronic device.

7. The IC of claim 6, wherein the first gate contact structure is electronically isolated except for the portion of the first gate contact structure that is electrically coupled through the sidewall of the gate region of the top electronic device.

8. The IC of claim 2, wherein the second conductive material is different from the first conductive material.

9. The IC of claim 1, wherein the isolation region is operable to electrically isolate at least a gate region of the top electronic device from a gate region of the bottom electronic device.

10. The IC of claim 6, wherein a second gate contact structure:

extends through the gate region of the top electronic device;

is electrically coupled to a gate region of the bottom electronic device through a top surface of the gate region of the bottom electronic device; and is electrically isolated from the gate region of the top electronic device.

11. A method of fabricating an integrated circuit (IC), the method comprising:

forming a stacked device configuration comprising a top electronic device positioned over a bottom electronic device;

forming an isolation region between the top electronic device and the bottom electronic device; and forming a first gate contact structure electrically coupled to a gate region of the top electronic device;

wherein a bottom surface of the first gate contact structure is on a portion of the isolation region;

wherein the gate region of the top electronic device comprises a top gate dielectric layer; and wherein the first gate contact structure extends through the top gate dielectric layer to allow the bottom surface of the first gate contact structure to be on the portion of the isolation region.

12. The method of claim 11, wherein:

the gate region of the top electronic device comprises a first conductive material;

the gate region of the bottom electronic device comprises a second conductive material; and a work function of the first conductive material is different from a work function of the second conductive material.

13. The method of claim 12, wherein:

the top electronic device comprises a p-type transistor; and the bottom electronic device comprises an n-type transistor.

14. The method of claim 12, wherein:

the top electronic device comprises an n-type transistor; and the bottom electronic device comprises a p-type transistor.

15. The method of claim 12, wherein:

the top electronic device comprises a memory device operable to perform storage operations; and the bottom electronic device comprises a transistor operable to perform logic operations.

16. The method of claim 11 further comprising electrically coupling a portion of the first gate contact structure to the gate region of the top electronic device through a sidewall of the gate region of the top electronic device.

17. The method of claim 16 further comprising electronically isolating the first gate contact structure except for the portion of the first gate contact structure that is electrically coupled through the sidewall of the gate region of the top electronic device.

18. The method of claim 12, wherein the second conductive material is different from the first conductive material.

19. The method of claim 18, wherein the isolation region is operable to electrically isolate at least a gate region of the top electronic device from a gate region of the bottom electronic device.

20. The method of claim 16 further comprising:

forming a second gate contact structure that extends through the gate region of the top electronic device;

electrically coupling the second gate contact structure to a gate region of the bottom electronic device through a top surface of the gate region of the bottom electronic device; and electrically isolating the second gate contact structure from the gate region of the top electronic device.

* * * * *